(12) United States Patent
Kobayashi et al.

(10) Patent No.: US 10,504,949 B2
(45) Date of Patent: Dec. 10, 2019

(54) SOLID-STATE IMAGING DEVICE, METHOD OF DRIVING SOLID-STATE IMAGING DEVICE, IMAGING SYSTEM, AND MOVABLE OBJECT

(71) Applicant: CANON KABUSHIKI KAISHA, Tokyo (JP)

(72) Inventors: Daisuke Kobayashi, Kawaguchi (JP); Toru Koizumi, Yokohama (JP); Kazuhiro Saito, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 123 days.

(21) Appl. No.: 15/712,611

(22) Filed: Sep. 22, 2017

(65) Prior Publication Data
US 2018/0102386 A1   Apr. 12, 2018

(30) Foreign Application Priority Data
Oct. 7, 2016   (JP) .................. 2016-199129

(51) Int. Cl.
*H01L 27/146*   (2006.01)
*H04N 5/355*   (2011.01)
(Continued)

(52) U.S. Cl.
CPC ..... *H01L 27/14609* (2013.01); *H04N 5/2353* (2013.01); *H04N 5/3532* (2013.01)

(58) Field of Classification Search
CPC .... H04N 5/2353; H04N 5/353; H04N 5/3532; H04N 5/374; H04N 5/3745; H04N 5/37452; H04N 5/378
(Continued)

(56) References Cited

U.S. PATENT DOCUMENTS 5,698,892 A   12/1997  Koizumi
6,188,094 B1   2/2001  Kochi
(Continued)

FOREIGN PATENT DOCUMENTS

EP   2107610   * 10/2009
EP   2107610 A2   10/2009
(Continued)

OTHER PUBLICATIONS

U.S. Appl. No. 15/630,013, filed Jun. 22, 2017, by Kazuhiro Saito, et al.
(Continued)

*Primary Examiner* — Sinh Tran
*Assistant Examiner* — Chan T Nguyen
(74) *Attorney, Agent, or Firm* — Venable LLP

(57) ABSTRACT

A solid-state imaging device includes pixels each of which includes a photoelectric converter configured to generate charges by photoelectric conversion, a holding unit configured to hold charges generated by the photoelectric converter, and a transfer unit configured to transfer charges from the photoelectric converter to the holding unit, and outputs a signal based on charges in the holding unit, a transfer control unit configured to control the transfer unit to transfer charges generated by the photoelectric converter during one exposure period to the holding unit by a variable number, which is one or greater, of transfer operations, an amplifier unit configured to amplify the signal, and a control unit configured to control a gain of the amplifier unit to be a first gain when the number of transfer operations is first number and to be a second gain when the number of transfer operations is a second number.

19 Claims, 14 Drawing Sheets

(51) Int. Cl.
  *H04N 5/374*    (2011.01)
  *H04N 5/3745*   (2011.01)
  *H04N 5/235*    (2006.01)
  *H04N 5/353*    (2011.01)

(58) Field of Classification Search
  USPC ............................................................ 348/296
  See application file for complete search history.

(56) References Cited

U.S. PATENT DOCUMENTS

| | | |
|---|---|---|
| 6,605,850 B1 | 8/2003 | Kochi |
| 6,670,990 B1 | 12/2003 | Kochi |
| 6,946,637 B2 | 9/2005 | Kochi |
| 6,960,751 B2 | 11/2005 | Hiyama |
| 7,016,089 B2 | 3/2006 | Yoneda |
| 7,110,030 B1 | 9/2006 | Kochi |
| 7,227,208 B2 | 6/2007 | Ogura |
| 7,321,110 B2 | 1/2008 | Okita |
| 7,324,144 B1 | 1/2008 | Koizumi |
| 7,348,615 B2 | 3/2008 | Koizumi |
| 7,408,210 B2 | 8/2008 | Ogura |
| 7,429,764 B2 | 9/2008 | Koizumi |
| 7,460,162 B2 | 12/2008 | Koizumi |
| 7,466,003 B2 | 12/2008 | Ueno |
| 7,528,878 B2 | 5/2009 | Sato |
| 7,538,810 B2 | 5/2009 | Koizumi |
| 7,547,871 B2 | 6/2009 | Hiyama |
| 7,550,793 B2 | 6/2009 | Itano |
| 7,554,591 B2 | 6/2009 | Kikuchi |
| 7,605,415 B2 | 10/2009 | Koizumi |
| 7,616,355 B2 | 11/2009 | Yoneda |
| 7,629,568 B2 | 12/2009 | Koizumi |
| 7,679,114 B2 | 3/2010 | Koizumi |
| 7,808,537 B2 | 10/2010 | Fujimura |
| 7,852,393 B2 | 12/2010 | Kikuchi |
| 7,864,384 B2 | 1/2011 | Yoneda |
| 7,872,286 B2 | 1/2011 | Okita |
| 7,906,755 B2 | 3/2011 | Koizumi |
| 7,907,196 B2 | 3/2011 | Ogura |
| 7,936,487 B2 | 5/2011 | Yoneda |
| 7,939,868 B2 | 5/2011 | Koizumi |
| 7,943,975 B2 | 5/2011 | Koizumi |
| 7,948,540 B2 | 5/2011 | Ogura |
| 7,948,541 B2 | 5/2011 | Koizumi |
| 7,973,839 B2 | 7/2011 | Koizumi |
| 7,978,241 B2 | 7/2011 | Koizumi |
| 8,053,718 B2 | 11/2011 | Koizumi |
| 8,063,958 B2 | 11/2011 | Okita |
| 8,085,319 B2 | 12/2011 | Ono |
| 8,089,545 B2 | 1/2012 | Koizumi |
| 8,120,681 B2 | 2/2012 | Ryoki |
| 8,169,525 B2 | 5/2012 | Ryoki |
| 8,174,600 B2 | 5/2012 | Ogura |
| 8,207,561 B2 | 6/2012 | Koizumi |
| 8,248,677 B2 | 8/2012 | Yoneda |
| 8,274,105 B2 | 9/2012 | Koizumi |
| 8,319,872 B2 | 11/2012 | Koizumi |
| 8,345,133 B2 | 1/2013 | Matsuda |
| 8,390,708 B2 | 3/2013 | Koizumi |
| 8,411,178 B2 | 4/2013 | Ogura |
| 8,416,473 B2 | 4/2013 | Yoneda |
| 8,421,894 B2 | 4/2013 | Koizumi |
| 8,441,558 B2 | 5/2013 | Okita |
| 8,477,224 B2 | 7/2013 | Ogura |
| 8,520,102 B2 | 8/2013 | Ogura |
| 8,520,108 B2 | 8/2013 | Ogura |
| 8,553,115 B2 | 10/2013 | Arishima |
| 8,553,118 B2 | 10/2013 | Saito |
| 8,598,901 B2 | 12/2013 | Hiyama |
| 8,624,307 B2 | 1/2014 | Koizumi |
| 8,670,049 B2 | 3/2014 | Ono |
| 8,670,056 B2 | 3/2014 | Kono |
| 8,698,935 B2 | 4/2014 | Okita |
| 8,711,259 B2 | 4/2014 | Maehashi |
| 8,749,675 B2 | 6/2014 | Koizumi |
| 8,797,435 B2 | 8/2014 | Koizumi |
| 8,836,838 B2 | 9/2014 | Nakamura |
| 8,872,092 B2 | 10/2014 | Ryoki |
| 8,878,971 B2 | 11/2014 | Ryoki |
| 8,883,526 B2 | 11/2014 | Okita |
| 8,896,029 B2 | 11/2014 | Koizumi |
| 8,928,786 B2 | 1/2015 | Iwata |
| 8,928,790 B2 | 1/2015 | Ogura |
| 8,957,364 B2 | 2/2015 | Ryoki |
| 8,975,676 B2 | 3/2015 | Koizumi |
| 9,007,501 B2 | 4/2015 | Matsuda |
| 9,029,752 B2 | 5/2015 | Saito |
| 9,048,155 B2 | 6/2015 | Matsuda |
| 9,083,906 B2 | 7/2015 | Nakamura |
| 9,113,103 B2 | 8/2015 | Matsuda |
| 9,118,857 B2 | 8/2015 | Iwata |
| 9,142,575 B2 | 9/2015 | Kobayashi |
| 9,232,165 B2 | 1/2016 | Saito |
| 9,253,425 B2 | 2/2016 | Ryoki |
| 9,276,036 B2 | 3/2016 | Arishima |
| 9,337,222 B2 | 5/2016 | Saito |
| 9,560,285 B2 | 1/2017 | Ichikawa |
| 9,602,753 B2 | 3/2017 | Saito |
| 2013/0135448 A1* | 5/2013 | Nagumo ............... G06T 3/4053 348/49 |
| 2013/0181118 A1 | 7/2013 | Koizumi |
| 2014/0263950 A1 | 9/2014 | Fenigstein et al. |
| 2015/0122975 A1 | 5/2015 | Saito |
| 2015/0173595 A1* | 6/2015 | Takekoshi .......... A61B 1/00009 600/317 |
| 2015/0264243 A1* | 9/2015 | Ichikawa ............. H04N 5/2353 348/296 |
| 2015/0281614 A1 | 10/2015 | Yoshida |
| 2015/0281616 A1 | 10/2015 | Muto |
| 2016/0247846 A1 | 8/2016 | Iida |
| 2017/0078603 A1 | 3/2017 | Yamasaki |
| 2017/0244921 A1* | 8/2017 | Velichko .......... H01L 27/14627 |

FOREIGN PATENT DOCUMENTS

| | | |
|---|---|---|
| JP | 2015-177349 | 10/2015 |
| WO | 2013/008425 A1 | 1/2013 |

OTHER PUBLICATIONS

U.S. Appl. No. 15/620,972, filed Jun. 13, 2017, by Takanori Yamashita, et al.
U.S. Appl. No. 15/674,285, filed Aug. 10, 2017, by Kazuhiro Saito, et al.
European Search Report dated Mar. 8, 2018 in European Application No. 17193966.3.

* cited by examiner

SOLID-STATE IMAGING DEVICE, METHOD OF DRIVING SOLID-STATE IMAGING DEVICE, IMAGING SYSTEM, AND MOVABLE OBJECT

BACKGROUND OF THE INVENTION

Field of the Invention

The present invention relates to a solid-state imaging device and a method of driving solid-state imaging device.

Description of the Related Art

In recent years, a CMOS image sensor having a global electronic shutter function has been proposed. The global electronic shutter refers to electric control of a capturing operation such that exposure periods are the same among a plurality of pixels. A use of global electronic shutter has an advantage that an object image is less likely to be distorted even when capturing an object moving fast.

Japanese Patent Application Laid-Open No. 2015-177349 discloses that a solid-state imaging device having a global electronic shutter function is configured to transfer charges from a photoelectric converter to a holding portion for multiple times during an exposure period, which results in an increase of the saturation charge amount of a pixel while suppressing an increase in pixel size.

In the configuration of transferring charges from a photoelectric converter to a holding portion for multiple times during an exposure period, however, the image quality may decrease. There is no consideration for such an issue in Japanese Patent Application Laid-Open No. 2015-177349.

SUMMARY OF THE INVENTION

An object of the present invention is to provide a solid-state imaging device and a method of driving the same that can suppress a decrease in image quality when configured to transfer charges from a photoelectric converter to a holding portion for multiple times during an exposure period.

According to one aspect of the present invention, there is provided a solid-state imaging device including a plurality of pixels, each of the plurality of pixels including a photoelectric converter configured to generate charges by photoelectric conversion, a holding unit configured to hold charges generated by the photoelectric converter, and a transfer unit configured to transfer charges from the photoelectric converter to the holding unit, and each of the plurality of pixels outputting a signal based on charges held in the holding unit, an output line connected to the plurality of pixels, the signal being output from the plurality of pixels to the output line, a transfer control unit configured to control the transfer unit to transfer charges generated by the photoelectric converter during one exposure period to the holding unit by a variable number of transfer operations, the variable number being one or greater, an amplifier unit configured to amplify the signal, and a control unit configured to control a gain of the amplifier unit to be a first gain when the number of transfer operations is a first number and to be a second gain different from the first gain when the number of transfer operations is a second number different from the first number.

Further, according to another aspect of the present invention, there is provided a method of driving a solid-state imaging device including a plurality of pixels, each of the plurality of pixels including a photoelectric converter configured to generate charges by photoelectric conversion, a holding unit configured to hold charges generated by the photoelectric converter, and a transfer unit configured to transfer charges from the photoelectric converter to the holding unit, and each of the plurality of pixels outputting a signal based on charges held in the holding unit, an output line connected to the plurality of pixels, the signal being output from the plurality of pixels to the output line, and an amplifier unit that amplifies the signal, the method including transferring charges generated by the photoelectric converter during one exposure period to the holding unit by a variable number of transfer operations, the variable number being one or greater, and controlling a gain of the amplifier unit to be a first gain when the number of transfer operations is a first number and to be a second gain different from the first gain when the number of transfer operations is a second number different from the first number.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A solid-state imaging device and a method of driving the same according to a first embodiment of the present invention will be described with reference to FIG. 1 to FIG. 6.

Figure 1:
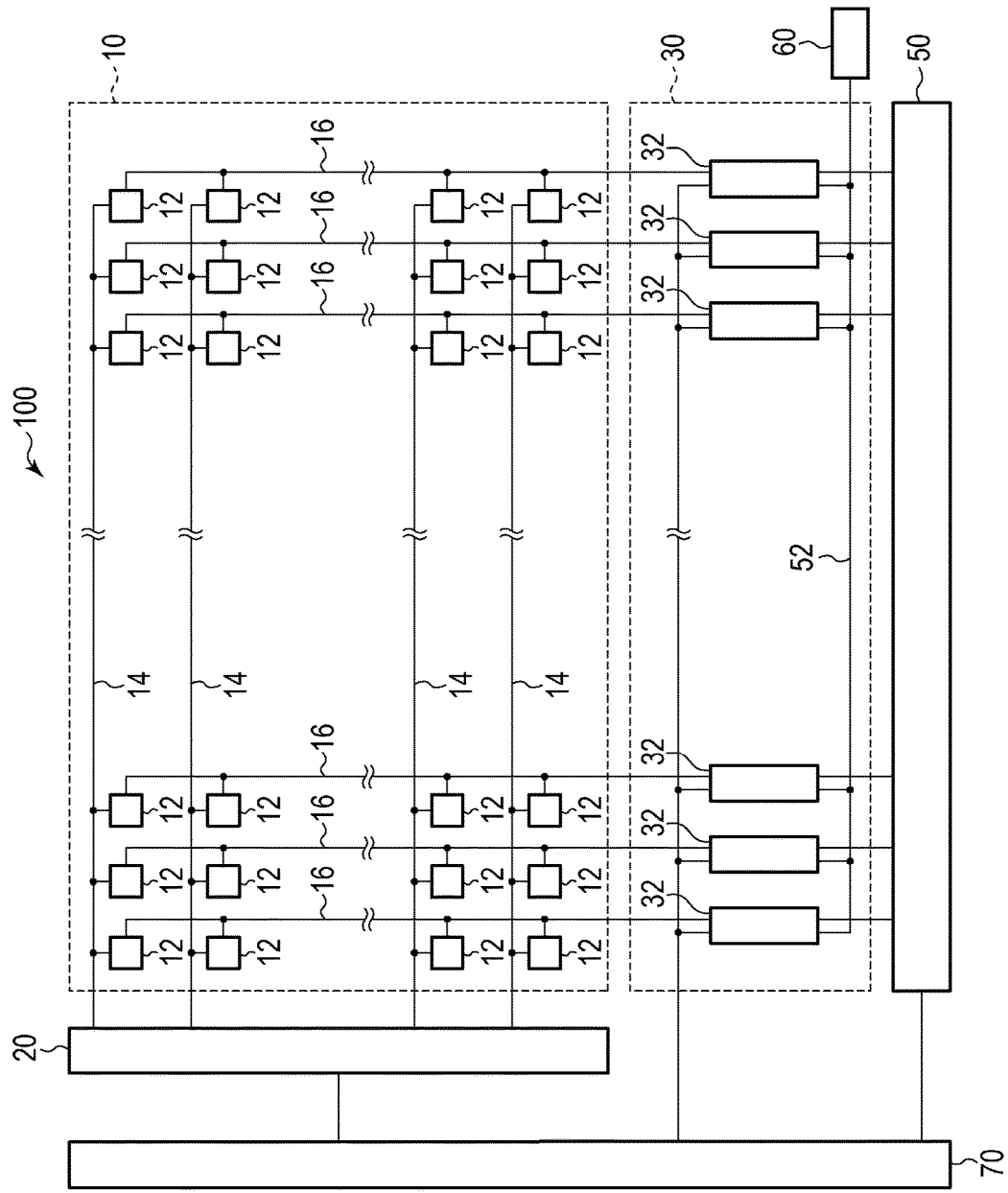
FIG. 1 is a block diagram illustrating a general configuration of a solid-state imaging device according to a first embodiment of the present invention.
Figure 2:
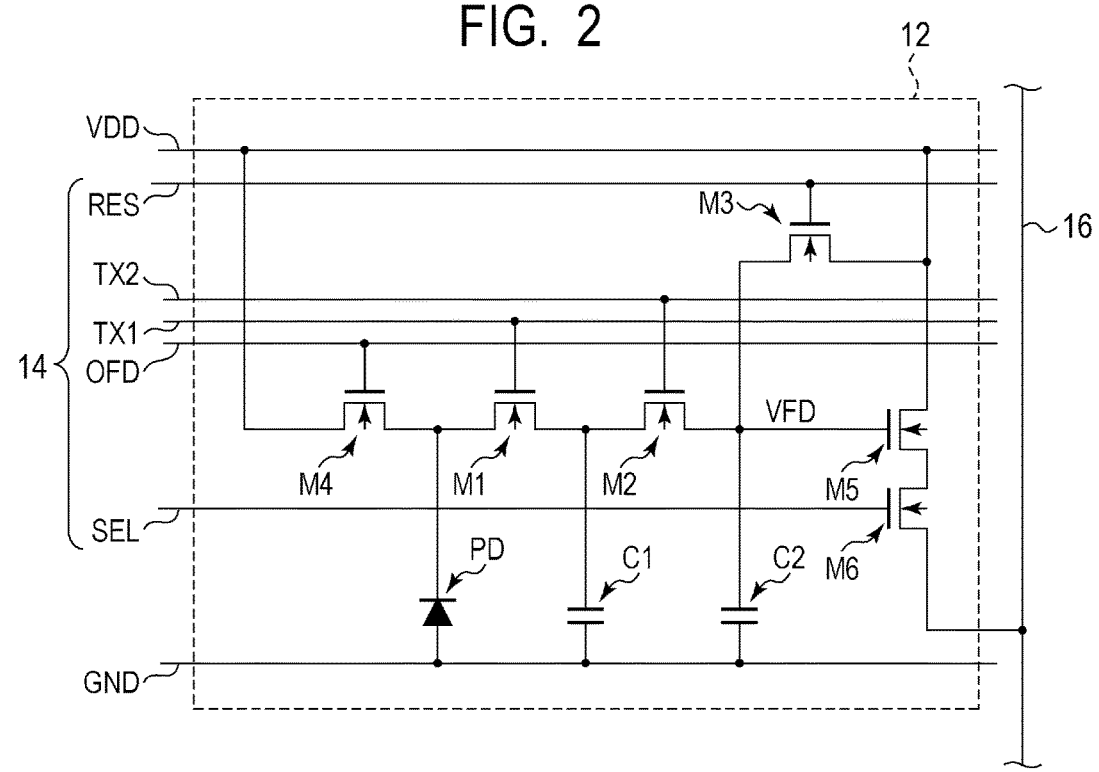
FIG. 2 is a circuit diagram illustrating an example configuration of a pixel of the solid-state imaging device according to the first embodiment of the present invention.
Figure 3:
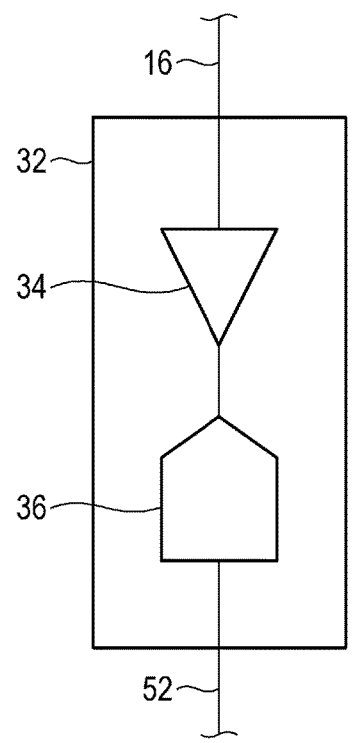
FIG. 3 is a block diagram illustrating an example configuration of a signal processing unit of the solid-state imaging device according to the first embodiment of the present invention.
Figure 4:
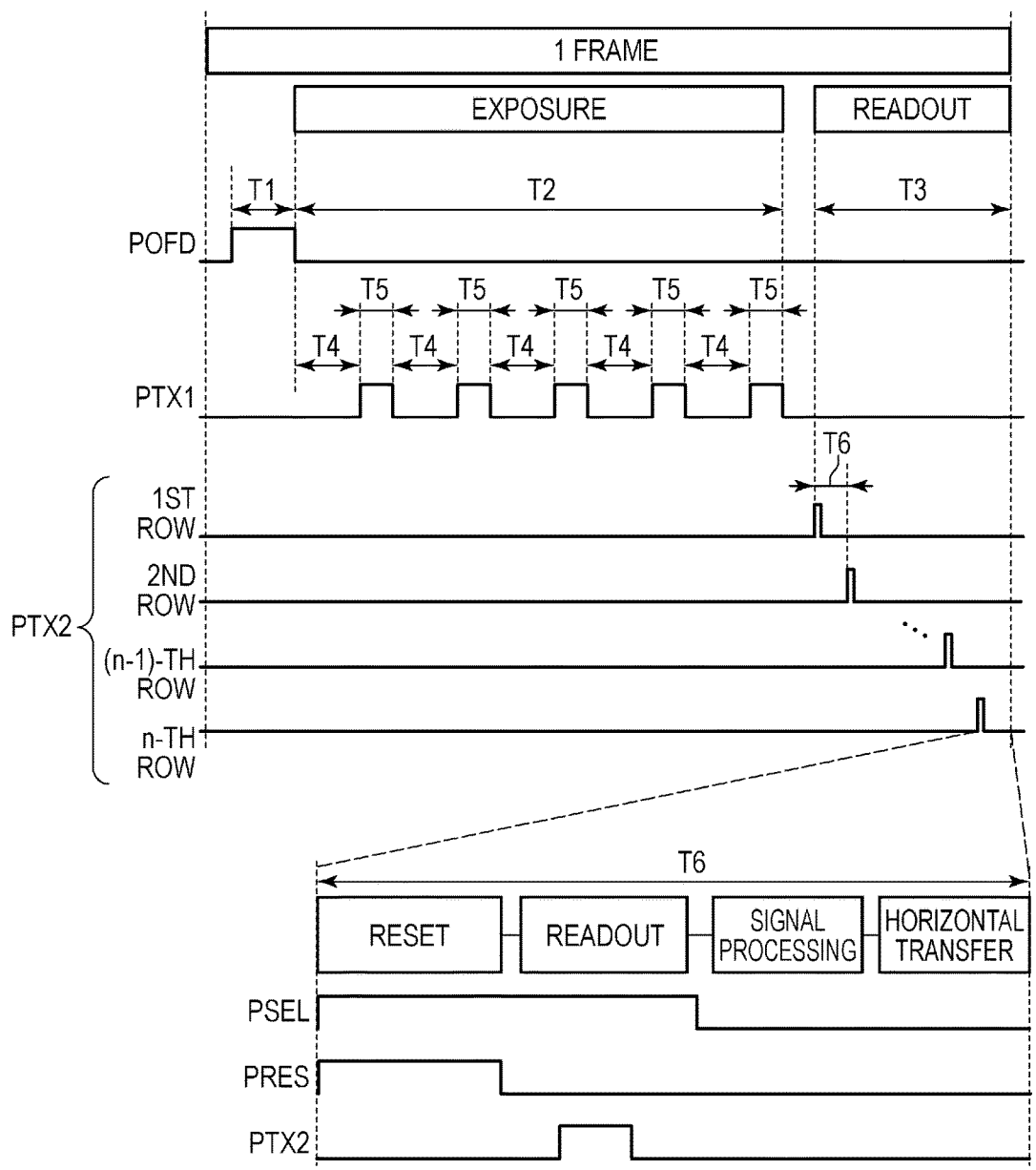
FIG. 4 is a timing diagram illustrating a method of driving the solid-state imaging device according to the first embodiment of the present invention.
Figure 5:
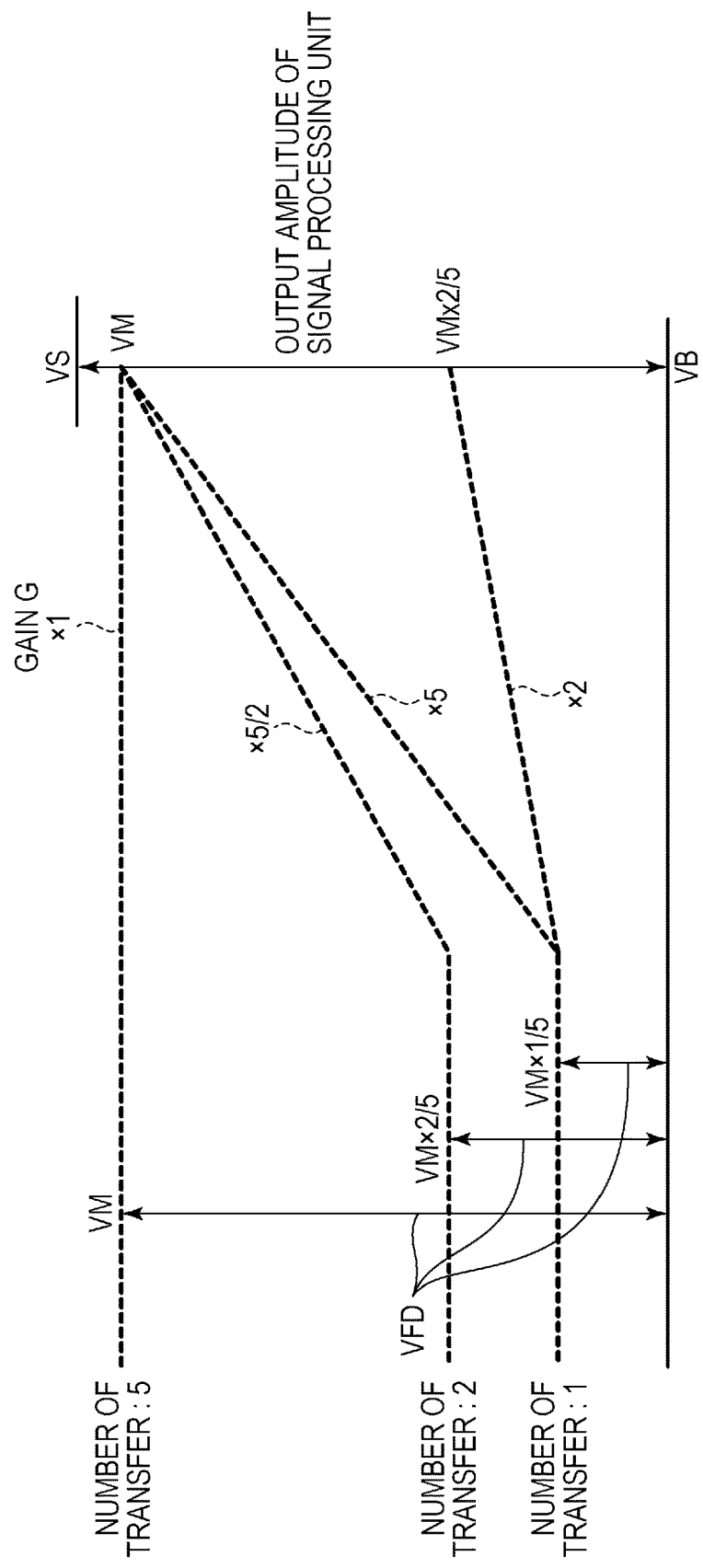
FIG. 5 is a diagram illustrating an example setting of the number of transfers and a gain in the method of driving the solid-state imaging device according to the first embodiment of the present invention.
Figure 6:
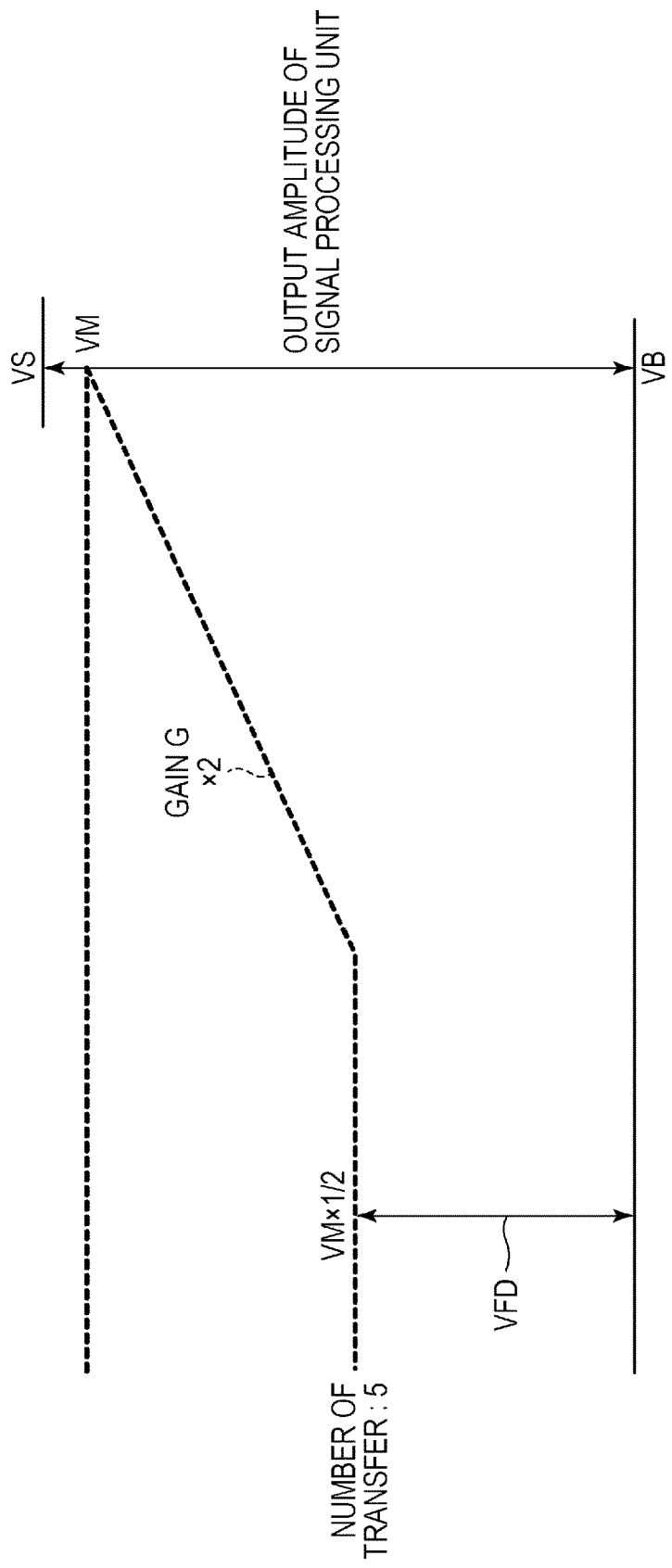
FIG. 6 is a diagram illustrating another example setting of the number of transfers and a gain in the method of driving the solid-state imaging device according to the first embodiment of the present invention.

FIG. 1 is a block diagram illustrating a general configuration of a solid-state imaging device according to the present embodiment. FIG. 2 is a circuit diagram illustrating an example configuration of a pixel of the solid-state imaging device according to the present embodiment. FIG. 3 is a block diagram illustrating an example configuration of a column signal processing unit of the solid-state imaging device according to the present embodiment. FIG. 4 is a timing diagram illustrating a method of driving the solid-state imaging device according to the present embodiment. FIG. 5 and FIG. 6 are diagrams illustrating example settings of the number of transfers and the gain in the method of driving the solid-state imaging device according to the present embodiment.

First, the structure of the solid-state imaging device according to the present embodiment will be described with reference to FIG. 1 to FIG. 3.

As illustrated in FIG. 1, a solid-state imaging device 100 according to the present embodiment includes a pixel array 10, a pixel drive unit 20, a signal processing unit 30, a horizontal scanning unit 50, a signal output unit 60, and a drive signal generation unit 70.

The pixel array 10 includes a plurality of pixels arranged over a plurality of rows and a plurality of columns. Each of the pixels 12 includes a photoelectric converter that converts an incident light into charges in accordance with a light amount of the incident light and outputs a pixel signal in accordance with the incident light amount.

A pixel drive signal line 14 extending in the row direction is arranged on each row of the pixel array 10. The pixel drive signal line 14 on each row is a signal line common to the pixels 12 which belong to the corresponding row. The pixel drive signal lines 14 are connected to the pixel drive unit 20. A pixel output line 16 extending in the column direction is arranged on each column of the pixel array 10. The pixel output line 16 on each column is a signal line common to the pixels 12 which belong to the corresponding column. The pixel output lines 16 are connected to the signal processing unit 30.

The pixel drive unit 20 is a control unit that controls photoelectric conversion operation, charge transfer operation, and readout operation of the pixel 12 by drive signals supplied via the pixel drive signal line 14. Although the pixel drive signal line 14 is depicted with a single signal line in FIG. 1, a plurality of drive signal lines are included in the actual implementation. The pixels on a row selected by the pixel drive unit 20 simultaneously output pixel signals to the pixel output line 16.

The signal processing unit 30 includes a plurality of column signal processing units 32 provided on every column of the pixel array 10. Each of the column signal processing units 32 is connected to the pixel output line 16 on the corresponding column. The column signal processing unit 32 is a circuit unit that performs predetermined signal processing on a pixel signal read out from the pixels 12 via the pixel output line 16. The column signal processing unit 32 has at least a function of amplifying a pixel signal and may have other functions such as analog-to-digital (A/D) conversion or the like if necessary.

The horizontal scanning unit 50 is provided for transferring the pixel signals processed in the signal processing unit 30 to the signal output unit 60 sequentially on a column basis. The horizontal scanning unit 50 sequentially supplies select signals to the column signal processing units 32 on respective columns. Thereby, the pixel signals processed in the column signal processing units 32 are output to a common output line 52 sequentially on a column basis. The horizontal scanning unit 50 is formed of a decoder, a shift resistor, or the like.

The signal output unit 60 is a circuit for outputting pixel signals read out from the pixels 12 to the outside of the solid-state imaging device. The signal output unit 60 may have a function of amplifying an output signal of the signal processing unit 30. In the configuration in which the signal processing unit 30 includes an A/D convertor, the pixel signal is output from the signal processing unit 30 as a digital signal and transferred to the signal output unit 60. In this case, the signal output unit 60 may have a digital signal processing function. The digital signal processing function which may be provided to the signal output unit 60 includes digital gain processing, offset addition processing, or the like. Further, the output configuration of the signal output unit 60 may include an output unit with a scheme that outputs a voltage from a single terminal, a Low Voltage Differential Signaling (LVDS) scheme having differential two terminals, or the like, for example. The pixel signal processed by the signal output unit 60 is output to the outside of the solid state imaging device 100.

The drive signal generation unit 70 supplies, to the pixel drive unit 20, the signal processing unit 30, and the horizontal scanning unit 50, the control signals for controlling drive or setting thereof. For example, the drive signal generation unit 70 sets the output timing of a signal supplied to the pixel drive unit 20 and the signal processing unit 30 and the gain of the pixel signals. The drive signal generation unit 70, together with the pixel drive unit 20, forms a transfer control unit adapted to control a transfer unit adapted to transfer charges from a photoelectric converter to a holding unit.

FIG. 2 is an example configuration of the pixel 12. Each of the pixels 12 includes a photoelectric converter PD, transfer transistors M1, M2, and M4, a reset transistor M3, an amplifier transistor M5, and a select transistor M6.

The photoelectric converter PD is a photodiode, for example. The anode of the photodiode of the photoelectric converter PD is connected to a ground voltage line GND, and the cathode thereof is connected to the source of the transfer transistor M1 and the source of the transfer transistor M4. The transfer transistor M4 may be called an overflow transistor. The drain of the transfer transistor M1 is connected to the source of the transfer transistor M2. The connection node between the transfer transistor M1 and the transfer transistor M2 includes a capacitance component and has a function of a charge holding unit C1.

The drain of the transfer transistor M2 is connected to the source of the reset transistor M3 and the gate of the amplifier transistor M5. A node VFD, which is the connection node of the drain of the transfer transistor M2, the source of the reset transistor M3, and the gate of the amplifier transistor M5, includes a capacitance component and has a function as a charge holding unit C2. The node VFD may be called a floating diffusion. The node VFD functions as an input node of an amplifier unit formed of the amplifier transistor M5.

The drain of the reset transistor M3, the drain of the transfer transistor M4, and the drain of the amplifier transistor M5 are connected to a power source voltage line VDD. The source of the amplifier transistor M5 is connected to the drain of the select transistor M6. The source of the select transistor M6 is connected to the pixel output line 16.

The capacitors of the holding units C1 and C2 are not limited in particular, and a p-n junction capacitor between a p-type semiconductor and an n-type semiconductor, a MIM capacitor of the structure in which a dielectric is interposed between metals, a MOS capacitor, a parasitic capacitor such as an interconnection capacitance, or the like may be applied thereto, for example.

In the case of the pixel configuration of FIG. 2, each of the pixel drive signal lines 14 arranged in the pixel array 10 includes signal lines TX1, TX2, RES, OFD, and SEL. The signal line TX1 is connected to the gates of the transfer transistors M1 of the pixels 12 which belong to the corresponding row. The signal line TX2 is connected to the gates of the transfer transistors M2 of the pixels 12 which belong to the corresponding row. The signal line RES is connected to the gates of the reset transistors M3 of the pixels 12 which belong to the corresponding row. The signal line OFD is connected to the gates of the transfer transistors M4 of the pixels 12 which belong to the corresponding row. The signal line SEL is connected to the gates of the select transistors M6 of the pixels 12 which belong to the corresponding row. The power source voltage line VDD and the ground voltage line GND are interconnections formed of signal lines extending in the row direction as illustrated in FIG. 2, signal lines extending in the column direction and connected commonly to each pixel 12, or the like.

A drive signal PTX1 that is the drive pulse for controlling the transfer transistor M1 is output to the signal line TX1 from the pixel drive unit 20. A drive signal PTX2 that is the drive pulse for controlling the transfer transistor M2 is output to the signal line TX2 from the pixel drive unit 20. A drive signal PRES that is the drive pulse for controlling the reset transistor M3 is output to the signal line RES from the pixel drive unit 20. A drive signal POFD that is the drive pulse for controlling the transfer transistor M4 is output to the signal line OFD from the pixel drive unit 20. A drive signal PSEL that is the drive pulse for controlling the select transistor M6 is output to the signal line SEL from the pixel drive unit 20. When each transistor is an n-channel transistor, the corresponding transistor is on state when a high level drive signal is supplied from the pixel drive unit 20, and the corresponding transistor is off state when a low level drive signal is supplied from the pixel drive unit 20.

The photoelectric converter PD converts (photoelectrically converts) an incident light into an amount of charges in accordance with a light amount thereof and accumulates the generated charges. The transfer transistor M4 resets the photoelectric converter PD to the potential of the power source voltage line VDD. The transfer transistor M1 transfers charges of the photoelectric converter PD to the holding unit C1. The holding unit C1 holds charges generated from an incident light in a location other than the photoelectric converter PD. The transfer transistor M2 transfers charges of the holding unit C1 to the holding unit C2. The holding unit C2 holds charges transferred from the holding unit C1 and sets the node VFD to a voltage in accordance with the capacitance thereof and the amount of the transferred charges. The reset transistor M3 resets the node VFD to the potential of the power source voltage line VDD. The select transistor M6 selects the pixel 12 from which a signal is output to the pixel output line 16. The amplifier transistor M5 is configured such that the power source voltage is supplied to the drain and a bias current is supplied to the source from a current source (not illustrated) via the select transistor M6, and thereby an amplifier unit (a source follower circuit) whose input node is the gate is formed. This causes the amplifier transistor M5 to output a signal based on charges generated by an incident light to the pixel output line 16 via the select transistor M6. Note that reset of the photoelectric converter PD may be performed at a different potential (not illustrated) or may be performed via the reset transistor M3 with the transfer transistors M1 and M2 being in an on-state.

FIG. 3 is an example configuration of the column signal processing unit 32. The column signal processing unit 32 includes an amplifier unit 34 and an A/D convertor 36. The amplifier unit 34 amplifies a pixel signal output from the pixel 12 via the pixel output line 16. The A/D converter 36 converts the amplified analog pixel signal output from the amplifier unit 34 into a digital signal. Note that the configuration of the column signal processing unit 32 is not limited to the above, may be a configuration with the amplifier unit 34 only or the A/D convertor 36 only, or may further have a correlated double sampling function.

Next, a method of driving the solid-state imaging device according to the present embodiment will be described with reference to FIG. 4 to FIG. 6. Note that each transistor is in an on-state when the corresponding drive signal is a high level and each transistor is in an off-state when the corresponding drive signal is a low level.

As illustrated in FIG. 4, the method of driving the solid-state imaging device according to the present embodiment includes a period T1, a period T2 after the period T1, and a period T3 after the period T2 within one frame period. The period T1 is a reset period of the photoelectric converter PD. The period T2 is an exposure period of the photoelectric converter PD. The period T3 is a readout period of a pixel signal. The period T2 includes periods T4 and periods T5. Each of the periods T4 is an accumulation period of signal charges in the photoelectric converter PD. Each of the periods T5 is a transfer period of signal charges from the photoelectric converter PD to the holding unit C1. The operation of the period T4 and the period T5 is performed once or performed repeatedly for multiple times as required during the period T2. The period T3 includes periods T6. Each of the periods T6 is a period that performs readout of pixel signals from pixels 12 on one row. When the pixel array 10 is formed of n rows, the operation of the periods T6 are performed sequentially on the first row to the n-th row, respectively.

First, in the period T1, the drive signal POFD supplied from the pixel drive unit 20 to the signal lines OFD on all the rows to be reset becomes a high level, and the transfer transistors M4 in all the pixels 12 are turned on. This causes the photoelectric converter PD to be connected to the power source voltage line VDD via the transfer transistor M4 and reset to the potential in accordance with the power source voltage.

After the period T1 has elapsed, once the drive signal POFD becomes a low level, the transfer transistors M4 of all the pixels 12 are in an off-state, and reset of the photoelectric converters PD is released. Thereby, in the photoelectric converters PD of all the pixels 12, charges in accordance with an amount of an incident light are generated by photoelectric conversion and accumulated. That is, one of the exposure periods is started. The timing when the drive signal POFD is transitioned from a high level to a low level is the end time of the period T1 and also the start time of the period T2.

During the period T2, the drive signal PTX1 supplied to the signal lines TX1 on all the rows are transitioned from a low level to a high level at least once. A period in which the drive signal PTX1 is a low level and the transfer transistor M1 is in an off-state is the period T4, and a period in which the drive signal PTX1 is a high level and the transfer transistor M1 is in an on-state is the period T5. In the period T5, charges which have been accumulated in the photoelectric converter PD so far are transferred to the holding unit C1.

The period T2 includes at least one period T5. The period T4 may be performed before the period T5, and when the multiple times of the periods T5 are performed, each period T4 is performed between the periods T5. The timing when the drive signal PTX1 is transitioned from a high level to a low level in the last period T5 is the end time of the period T2. As a result, charges generated by the photoelectric converter PD during the period T2 are transferred from the photoelectric converter PD to the holding unit C1 and held in the holding unit C1.

In the present embodiment, an example of repeatedly performing the period T4 and the period T5 for five times during the period T2 is illustrated. The number of repetitions of the period T4 and the period T5 during the period T2 is not limited to five. Further, the interval of the periods T5, that is, the periods T4 are not necessarily required to have an even length. Further, when multiple times of the periods T5 are performed, the periods T5 are not necessarily required to have an even length. Further, before the operation of the period T4 is again performed after the period T5, the operation of resetting the photoelectric converter PD (the operation of the period T1) may be performed. One exposure period is defined as a period from the time when reset of the photoelectric converter PD is first released to the time when charges held in the holding unit C1 are read out. That is, during one exposure period, the photoelectric converter PD may be reset.

After the end of the period T2, the period T3 is performed. In the period T3, readout operations of signals based on charges held in the holding units C1 of respective pixels 12 to the pixel output lines 16 (the periods T6) are performed sequentially on a row basis. Upon the completion of the readout of the pixel signal from the pixel 12 on the last row (n-th row), the period T3 ends.

As illustrated in FIG. 4, the readout operation of each row in the period T6 includes a reset period, a readout period, a signal processing period, and a horizontal transfer period.

In the reset period and the readout period, the drive signal PSEL supplied to the signal line SEL on the row to be read out is set to a high level, causing the select transistors M6 of the pixels 12 on the associated row to be turned on. This causes the pixels 12 on the associated row to be selected resulting in a state where a pixel signal can be read out from the selected pixels 12 to the pixel output lines 16.

In the reset period, the drive signal PRES supplied to the signal line RES on the row to be read out is set to a high level, causing the reset transistors M3 on the associated row to be turned on. Thereby, the VFD node is connected to the power source voltage line VDD via the reset transistor M3 and reset to the potential (the reset potential) in accordance with the power source voltage.

In the subsequent readout period, first, after the reset transistor M3 is turned off, a reference signal (N signal) in accordance with the reset potential of the VFD node is output to the pixel output line 16. Next, once the drive signal PTX2 supplied to the signal line TX2 on the row to be read out becomes a high level, the transfer transistor M2 is turned on. Thereby, charges held in the holding unit C1 are transferred to the holding unit C2, causing the VFD node to have a potential in accordance with charges transferred to the holding unit C2 by charge-to-voltage conversion performed due to the capacitor of the holding unit C2. After the transfer transistor M2 is turned off, a pixel signal (S signal) in accordance with a charge amount transferred from the holding unit C1 to the holding unit C2 is output to the pixel output line 16.

In the signal processing period, predetermined signal processing such as an amplification process, an A/D conversion process, or the like is performed on the N signal and the S signal that have been output to the signal processing unit 30 via the pixel output line 16. In the horizontal transfer period, the N signal and the S signal that have been processed by the column signal processing units 32 on respective columns are transferred to the signal output unit 60 via the common output line 52 sequentially on a column basis according to the control signal from the horizontal scanning unit 50.

In such a way, it is possible to perform a so-called global electronic shutter operation in which a capturing operation that periods of photoelectric conversion operations and periods of accumulation operations (the period T2) of the photoelectric converters PD are the same among the plurality of pixels 12.

In the method of driving the solid-state imaging device according to the present embodiment, the transfer transistor M1 is turned on for multiple times (five times in this example) to intermittently transfer charges from the photoelectric converter PD to the holding unit C1 during an exposure period (period T2). The number of times of turning on the transfer transistor M1 during one exposure period is changed in accordance with a capturing condition such as a brightness of an object. In other words, charges generated by the photoelectric converter PD during one exposure period are transferred to the holding unit C1 by one or more variable times of transfer operations. One of the reasons for intermittently performing multiple times of charge transfer from the photoelectric converter PD to the holding unit C1 is to ensure a saturation charge amount of the pixel 12 while suppressing an increase in pixel size.

In order to transfer charges by one time of transfer from the photoelectric converter PD to the holding unit C1, it is required that the saturation charge amount of the photoelectric converter PD and the saturation charge mount of the holding unit C1 be substantially the same as each other. In this case, in order to increase the saturation charge amount of the pixel 12, it is required to increase the saturation charge mount of the photoelectric converter PD and the saturation charge mount of the holding unit C1 together, and therefore an increase in pixel size is inevitable.

The configuration in which transfer of charges from the photoelectric converter PD to the holding unit C1 is divided into multiple times can ensure the saturation charge amount of the pixel 12 without increasing the saturation charge mount of the photoelectric converter PD. For example, the saturation charge amount QP can be around QM/N, where QP denotes a saturation charge amount of the photoelectric converter PD, QM denotes a saturation charge amount of the holding unit C1, and N denotes the number of transfers from the photoelectric converter PD to the holding unit C1, and thus the increase in pixel size can be suppressed.

As an example, it is assumed that the saturation charge amount QM of the holding unit C1 is M times the saturation charge amount QP of the photoelectric converter PD (that is, M times of transfers of charges corresponding to the saturation charge amount QP from the photoelectric converter PD causes the holding unit C1 to reach the saturation charge amount QM). In this case, the maximum saturation charge amount of the pixel 12 is the saturation charge amount QM of the holding unit C1, which is equal to the charge amount when the photoelectric converter PD saturates for M times. That is, with the configuration that transfers charges corresponding to the saturation charge amount QP for M times from the photoelectric converter PD, the pixel 12 can be used at the maximum saturation charge amount. The number of charge transfers when the pixel 12 is used at the maximum saturation charge amount corresponds to a ratio (QM/QP) of the saturation charge amount QM of the holding unit C1 to the saturation charge amount QP of the photoelectric converter PD. Further, the post-stage circuit has a dynamic range by which a signal corresponding to the maximum saturation charge amount of the pixel 12, that is, the saturation charge amount QM of the holding unit C1 can be handled.

When charge transfer from the photoelectric converter PD to the holding unit C1 is performed for N times at a constant interval, the period T2 is expressed by the following Equation (1).

$$T2=(T4+T5)\times N \qquad (1)$$

When N=M, the pixel 12 can be used at the maximum saturation charge amount. In the case of a much bright object, charges of the saturation charge amount QP of the photoelectric converter PD can be transferred in each transfer operation. Also in this case, the signal level is included in the dynamic range of the post-stage circuit. On the other hand, if M times of charge transfers are similarly performed when capturing a dark scene, the amount of charges transferred at once is less than the saturation charge amount QP of the photoelectric converter PD. That is, only charges less than the saturation charge amount QM of the holding unit C1 occur during one exposure period. In this case, with the number of transfers N being reduced to less than M, the increase in noise or power consumption which may occur at the transfer operation can be suppressed. Since the amount of charges to be handled is reduced, a margin to a signal level to be output is provided in the dynamic range of the post-stage circuit. Thus, when the number of transfers is small, the gain G of the amplifier unit can be increased. When a pixel signal is amplified by the signal processing unit 30 as seen in the drive method of the present embodiment, the relationship between the number of transfers N of charges from the photoelectric converter PD to the holding unit C1 and the gain G in the signal processing unit 30 can be defined as illustrated below.

FIG. 5 illustrates the relationship between a voltage amplitude of the node VFD and an output amplitude of the signal processing unit 30 when the saturation charge amount QM is five times the saturation charge amount QP (M=5). In considering a voltage amplitude, it is assumed that the voltage VB is the reference to the voltage amplitude of the node VFD and the output amplitude of the signal processing unit 30. Note that, for simplified illustration here, the gain of the amplifier unit of the pixel 12 including the amplifier transistor M5 is assumed to be one. Further, in FIG. 5, VS [V] is expected to be an output range of the signal processing unit 30, that is, the maximum output amplitude.

When the maximum value (corresponding to the saturation charge amount QM) of the voltage amplitude of the node VFD is VM [V], the voltage amplitude of the node VFD is VM×(1/5) [V] when N=1, and the voltage amplitude of the node VFD is VM×(2/5) [V] when N=2, for example.

Thus, the method of driving the solid-state imaging device according to the present embodiment changes the setting of the gain G of the signal processing unit 30 in accordance with the setting of the number of transfers N of charges from the photoelectric converter PD to the holding unit C1. For example, it is defined that the gain G of the signal processing unit 30 is 1 when the number of transfers N is 5, the gain G of the signal processing unit 30 is 5/2 when the number of transfers N is 2, and the gain G of the signal processing unit 30 is 5 when the number of transfers N is 1. That is, the gain G is larger for the smaller number of transfers N compared to M such that the signal level corresponding to the saturation charge amount of the pixel 12 in accordance with the number of transfers is included in the output range of the signal processing unit 30. This results in that the maximum value of the output amplitude of the signal processing unit 30 is VM [V] regardless of the number of transfers N, and the signal processing unit 30 can be used near the maximum output amplitude VS [V].

Note that, when the number of transfers N is less than M, it is not necessarily required to set the gain G of the signal processing unit 30 so that the maximum value of the output amplitude is VM [V]. For example, the gain G of the signal processing unit 30 may be 2 when the number of transfers N is 1 resulting in that the maximum value of the output amplitude of the signal processing unit 30 is VM×2/5 [V].

The relationship between the number of transfers N from the photoelectric converter PD to the holding unit C1 and the gain G of the signal processing unit 30 can be set in various ways as a mode of the solid-state imaging device in accordance with the situation of capturing, the relationship of signal processing among blocks of the solid-state imaging device, or the like. For example, when it is intended to use the pixel 12 at the maximum saturation charge amount, the number of transfers N is set to 5 (=M) and the gain G is set to 1. When it is intended to use the signal processing unit 30 near the maximum output amplitude VS [V] while shortening the period T2 for faster capturing, the number of transfers N is set to 1 and the gain G is set to 5. When it is intended to use the output amplitude of the signal processing unit 30 in a range smaller than the VM [V], for example, VM/2 [V] in accordance with the input/output range of the signal output unit 60 or a device outside the solid-state imaging device while using the pixel 12 at the maximum saturation charge amount, the number of transfers N is set to 5 and the gain G is set to 1/2.

FIG. 6 illustrates the relationship between a voltage amplitude of the VFD node and an output amplitude of the signal processing unit 30 when the exposure period (the period T2) is shortened to half. The number of transfers N from the photoelectric converter PD to the holding unit C1 is 5. In this example, since the exposure period (the period T2) is half while the number of transfers N from the photoelectric converter PD to the holding unit C1 is 5, the voltage amplitude of the node VFD is VM×½ [V]. In this case, with the gain G of the signal processing unit 30 being 2, the signal processing unit 30 can be used with the output amplitude VM [V] near the maximum output amplitude VS [V]. That is, this drive example is an example in which the gain G is set larger for the greater number of transfers when the number of transfers is greater than or equal to M and the signal based on charges accumulated in the holding unit is less than the signal level corresponding to the maximum saturation charge amount of the pixel 12.

The example of FIG. 6 is an example which focuses on setting the greater number of transfers of charges from the photoelectric converter PD to the holding unit C1 per unit time rather than focusing on the saturation charge amount, and is useful in distributing the accumulation period.

For example, when brightness or darkness of an object changes, that is, the light amount changes at a cycle shorter than a charge transfer cycle in the exposure period, the configuration that transfers charges once during the exposure period leads to an accumulation result that is always bright or always dark, and thus the object may not be correctly captured.

In contrast, with the configuration that transfers charges for multiple times during an exposure period, the accumulation period is temporally distributed. The effect of time distribution increases as the number of charge transfers per unit time increases. That is, with the increased number of charge transfers per unit time being set, both charge accumulation in a bright state and charge accumulation in a dark state can be performed and the averaged value thereof is the accumulation result, which allows for more accurately capturing an object whose brightness and darkness may vary.

On the other hand, there is a concern that multiple times of turning on the transfer transistor M1 for performing multiple times of charge transfer during an exposure period may lead to an increase of a noise component due to the operation of the transfer transistor M1. In the method of driving the solid-state imaging device according to the present embodiment, however, by increasing the gain G of the signal processing unit 30 in the post-stage, an influence of an increase of noise due to multiple times of turning on the transfer transistor M1 can be reduced relatively to the entire noise. That is, as one of the solutions for suppressing a reduction of the image quality, it is possible to employ a setting of increasing the gain G while shortening the exposure period T2 to relatively reduce a cycle of turning on the transfer transistor M1.

Any of the various drive modes described in the present embodiment may be set in the drive signal generation unit 70, or the number of transfers N or the gain G may be automatically set in the drive signal generation unit 70 with reference to output data or the like of the previous frame. Further, the amplification process may be configured to be implemented in the signal output unit 60 or may be configured to be implemented in a signal processing unit (not illustrated) outside the solid-state imaging device, without limited to be implemented in the signal processing unit 30. Alternatively, a desired gain G may be obtained by using any combination of these amplifier units.

Note that the ratio of the saturation charge amounts of the photoelectric converter PD and the holding unit C1 and the combination of the number of transfers N of charges and the gain G of the signal processing unit 30 are not limited to the example illustrated in the present embodiment. Further, although the present embodiment has been described focusing on the times of turning on the transfer transistor M1, the same advantage can be obtained by the configuration that may turn on the transfer transistor M2 for multiple times. In this case, however, the advantage is obtained not by a global electronic shutter operation but by a rolling electronic shutter operation, and therefore the holding unit C1 and the transfer transistors M1 and M4 may be omitted in view of the configuration of the pixel 12.

As discussed above, according to the present embodiment, since the gain of the amplifier unit can be adjusted in accordance with the signal level of the node VFD that varies with the saturation charge amount of a pixel or the number of charge transfers, a high quality image can be captured with the optimal mode suitable to a capturing condition.

Second Embodiment

A solid-state imaging device and a method of driving the same according to a second embodiment of the present invention will be described with reference to FIG. 7 to FIG. 10. Components similar to those of the solid-state imaging device of the first embodiment are labeled with the same reference numerals, and the description thereof will be omitted or simplified.

Figure 7:
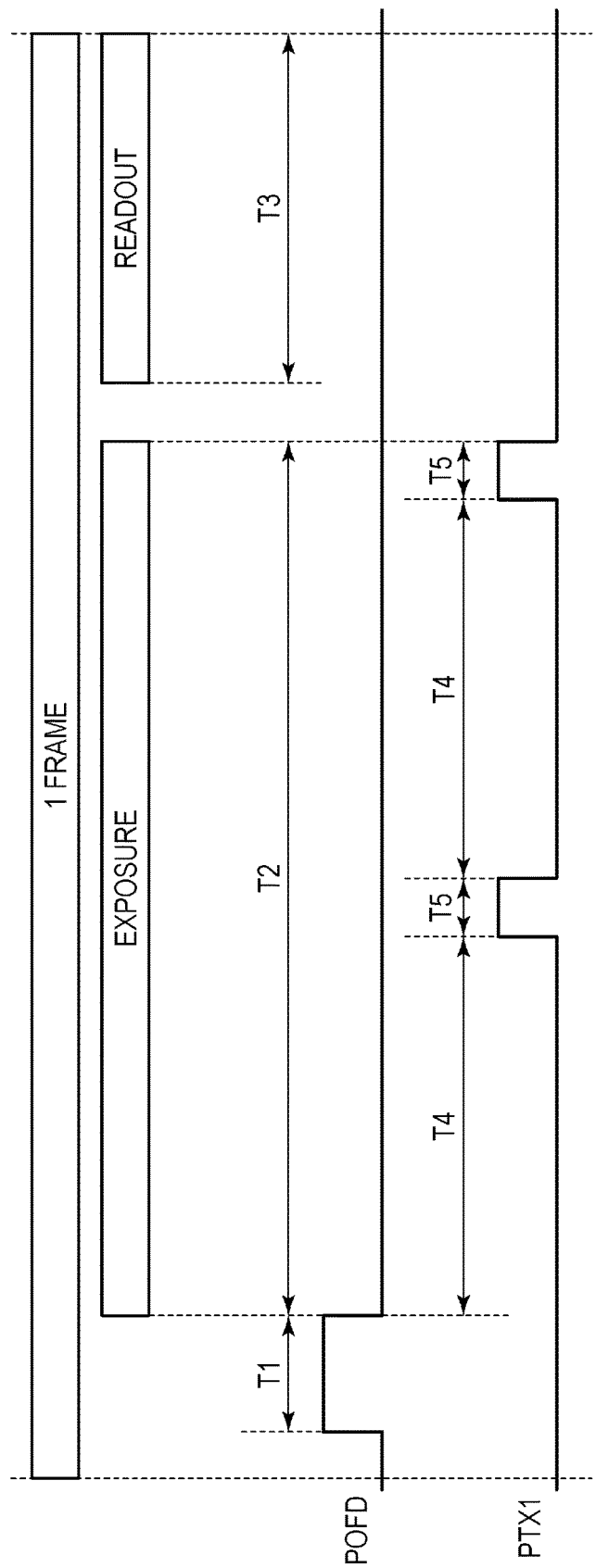
FIG. 7 is a timing diagram illustrating an example drive operation of the solid-state imaging device when the number of transfers is two.
Figure 8:
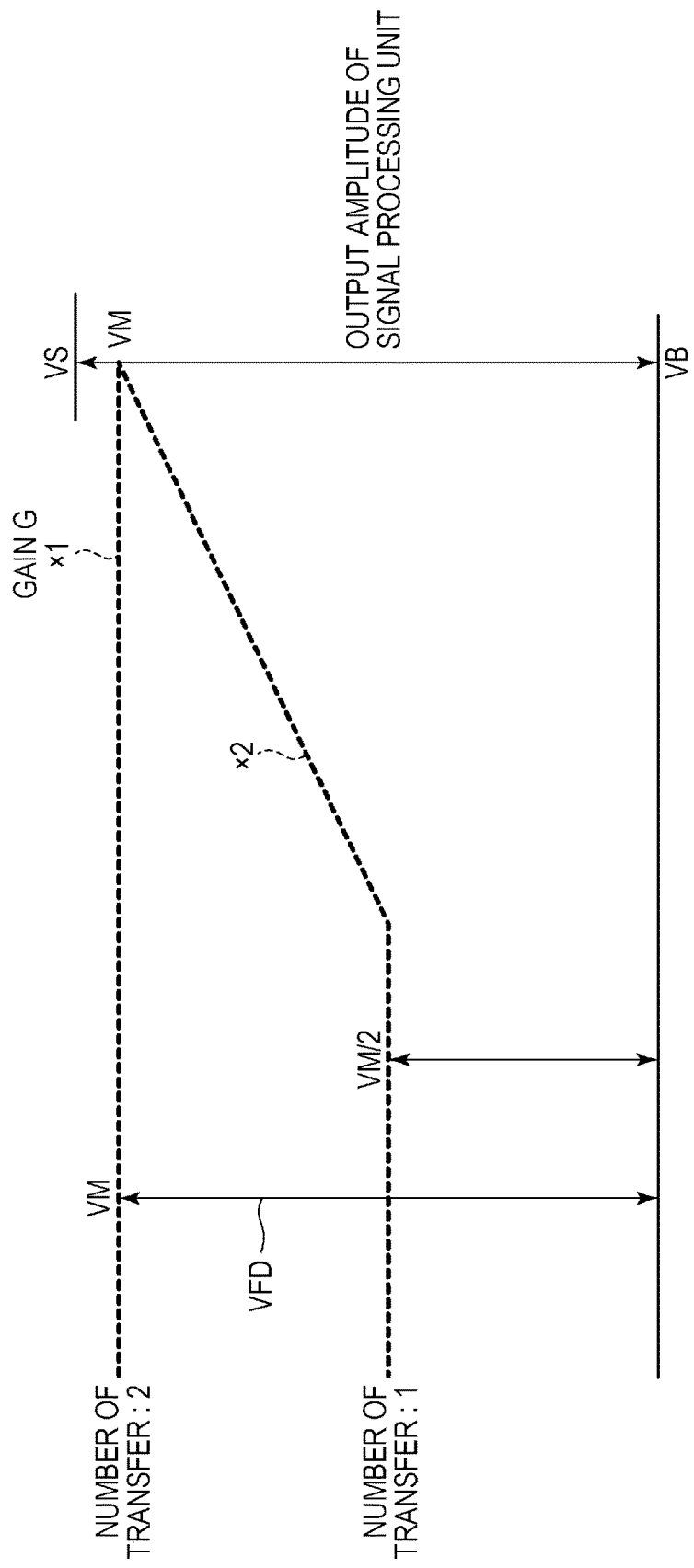
FIG. 8 is a diagram illustrating an example setting of the number of transfers and a gain in the example drive operation of FIG. 7.
Figure 9:
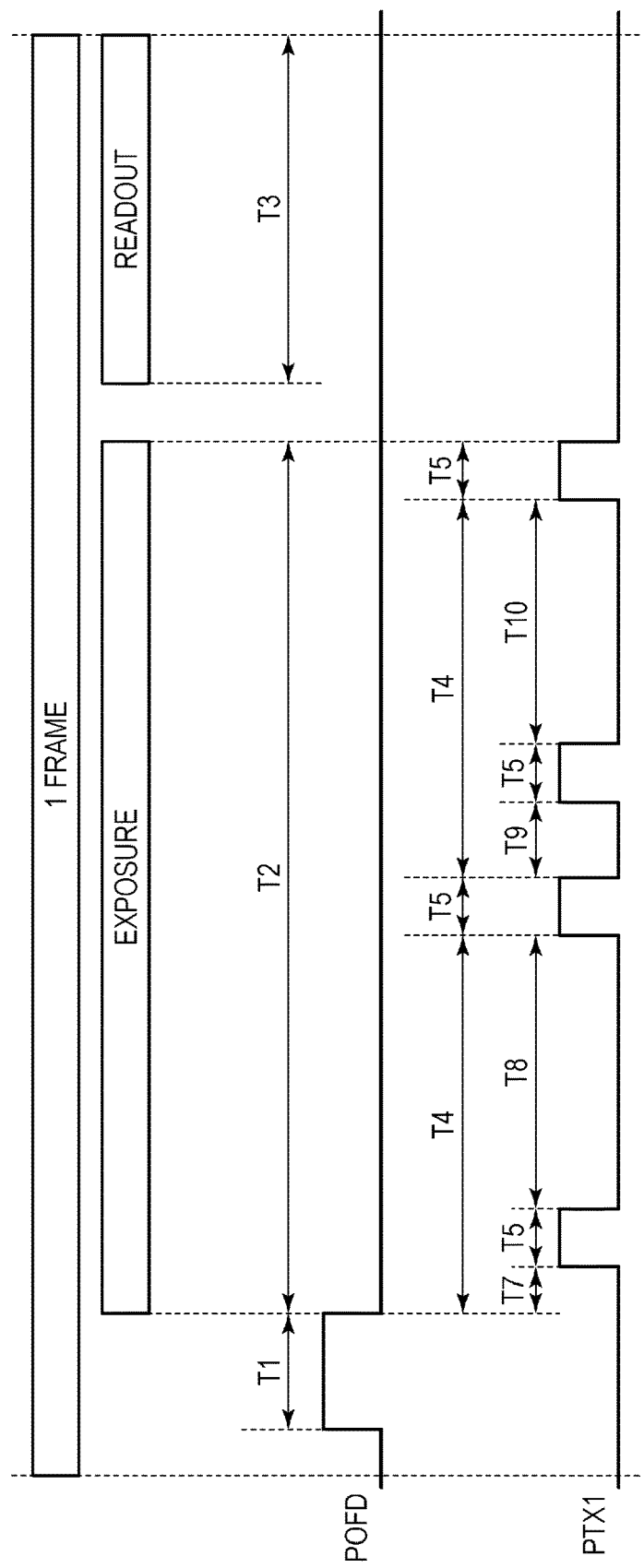
FIG. 9 is a timing diagram illustrating a method of driving a solid-state imaging device according to a second embodiment of the present invention.
Figure 10:
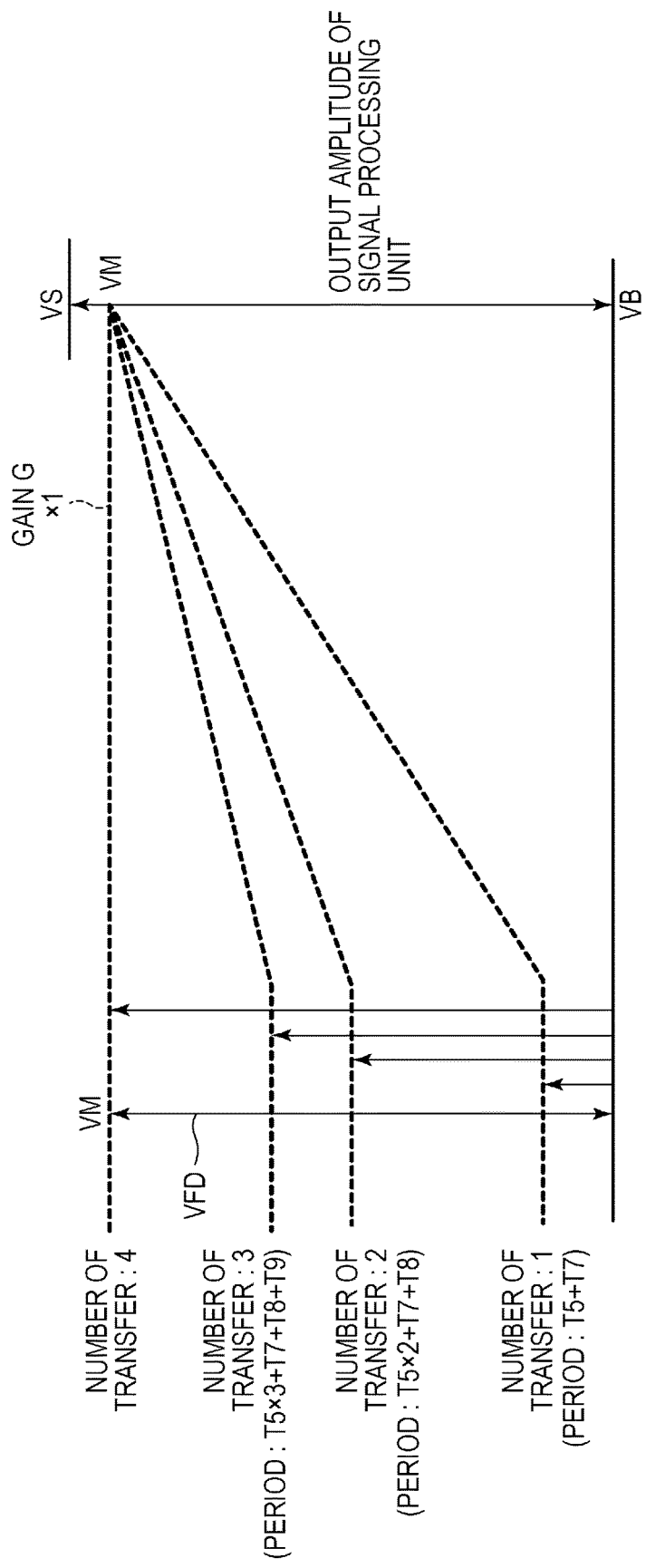
FIG. 10 is a diagram illustrating an example setting of the number of transfers and a gain in the method of driving the solid-state imaging device according to the second embodiment of the present invention.

FIG. 7 is a timing diagram illustrating an example drive operation of a solid-state imaging device when the number of transfers is two. FIG. 8 is a diagram illustrating an example setting of the number of transfers and a gain in the example drive operation of FIG. 7. FIG. 9 is a timing diagram illustrating the method of driving the solid-state imaging device according to the present embodiment. FIG. 10 is a diagram illustrating an example setting of the number of transfers and a gain in the method of driving the solid-state imaging device according to the present embodiment.

In the present embodiment, another method of driving the solid-state imaging device according to the first embodiment illustrated in FIG. 1 to FIG. 3 will be described. In the present embodiment, a method of driving the solid-state imaging device which can more effectively realize distribution of accumulation time is illustrated.

For simplified illustration here, it is assumed that the ratio of the saturation charge amount QP of the photoelectric converter PD and the saturation charge amount QM of the holding unit C1 is 1:2. The saturation charge amount QM of the holding unit C1 is the same value as that illustrated in FIG. 4 and FIG. 5 of the first embodiment. In this case, when N=M=2 is satisfied, the pixel 12 can be used at the maximum saturation charge amount.

FIG. 7 is a timing diagram illustrating the operation within one frame period when the number of signal charge transfers from the photoelectric converter PD to the holding unit C1 is two. This example drive operation is the same as that of the timing diagram of FIG. 4 except that the number of repetitions of the period T4 and the period T5 during the period T2 is two.

FIG. 8 illustrates an example setting of the gain G in the signal processing unit 30 in the case of example drive operation of FIG. 7. In the case of the example drive operation of FIG. 7, the signal processing unit 30 can be used near the maximum output amplitude VS [V] by setting the gain G in the signal processing unit 30 to 2 when the number of transfers N is 1 and setting the gain G in the signal processing unit 30 to 1 when the number of transfers N is 2.

In the method of driving the solid-state imaging device according to the present embodiment, each of the periods T4 is further divided into a plurality of accumulation periods if necessary based on the example drive operation of FIG. 7.

For example, as illustrated in FIG. 9, the initial period T4 is divided into a period T7, the period T5, and a period T8, and the next period T4 is divided into a period T9, the period T5, and a period T10. The periods T7, T8, T9, and T10 are accumulation periods of signal charges in the photoelectric converter PD similarly to the original period T4. The period T5 is a transfer period of signal charges from the photoelectric converter PD to the holding unit C1. That is, the number of signal charge transfers from the photoelectric converter PD to the holding unit C1 within the period T2 is four.

The periods T7 and T8 can be set in any way as long as the relationship of T4=T7+T5+T8 is satisfied. Similarly, the periods T9 and T10 can be set in any way as long as the relationship of T4=T9+T5+T10 is satisfied. That is, the periods T7, T8, T9, and T10 can be set to any lengths different from each other by controlling the timing of the drive signal PTX1. Thereby, these accumulation periods (the periods T4, T7, T8, T9, T10) can be uneven and therefore less affected by a periodical change of the light amount of an object. Therefore, the distribution of accumulation periods described in the first embodiment can be further effectively implemented.

The reason why the present embodiment is modified based on the example drive operation of FIG. 7 is not to cause the accumulation periods (the periods T7, T8, T9, T10) of signal charges in the photoelectric converter PD to exceed the period T4. This enables the pixel 12 to be used with the maximum saturation charge amount regardless of a dividing form of the period T2. Note that, instead of modifying the example drive operation of FIG. 7 as a basis, the entire period T2 may be divided into a plurality of accumulation periods which do not exceed the length of the period T4.

FIG. 10 illustrates an example setting of the gain G in the signal processing unit 30 in the drive example of FIG. 9. Also in the present embodiment, in a similar manner to the case of the first embodiment, the signal processing unit 30 is used near the maximum output amplitude VS [V] by setting the gain G in the signal processing unit 30 as appropriate in accordance with the number of transfers (accumulation periods) of signal charges from the photoelectric converter PD to the holding unit C1.

Note that, in FIG. 10, the case where the number of transfers is one refers to a case where signal charges are transferred from the photoelectric converter PD to the holding unit C1 only in the period T5 after the period T7 within the period T2. The case where the number of transfers is two refers to a case where signal charges are transferred from the photoelectric converter PD to the holding unit C1 in the periods T5 after the period T7 and after the period T8 within the period T2. The case where the number of transfers is three refers to a case where signal charges are transferred from the photoelectric converter PD to the holding unit C1 in the periods T5 after the period T7, after the period T8, and after the period T9 within the period T2. The case where the number of transfers is four refers to a case where signal charges are transferred from the photoelectric converter PD to the holding unit C1 in the periods T5 after the period T7, after the period T8, after the period T9, and after the period T10 within the period T2.

Although each of the two periods T4 within the period T2 is divided into two accumulation periods in the example drive operation of FIG. 9, the form of dividing the period T4 is not limited thereto. For example, the period T4 may be divided into three or more accumulation periods. Further, all the periods T4 may not be necessarily required to be divided into a plurality of accumulation periods, and some of the periods T4 may be divided. Further, the period T2 may include three or more periods T4.

The interval or the number of transfers of signal charges from the photoelectric converter PD to the holding unit C1 may be changed on a frame basis (on an exposure period basis) or on a row basis. In this case, the advantage of distributed accumulation periods can be obtained even for an object where the light amount varies at the same cycle as the interval of one frame or the interval of one row.

As discussed above, according to the present embodiment, since the gain of the amplifier unit can be adjusted in accordance with the signal level of the node VFD that varies with the saturation charge amount of a pixel or the number of charge transfers, a high quality image can be captured with the optimal mode suitable to a capturing condition. Further, with the transfer interval of charges being set at random, the advantage of distributed accumulation periods can be enhanced to acquire a higher quality image.

Third Embodiment

A solid-state imaging device and a method of driving the same according to a third embodiment of the present invention will be described with reference to FIG. 11. Components similar to those of the solid-state imaging device of the first and second embodiments are labeled with the same reference numerals, and the description thereof will be omitted or simplified.

Figure 11:
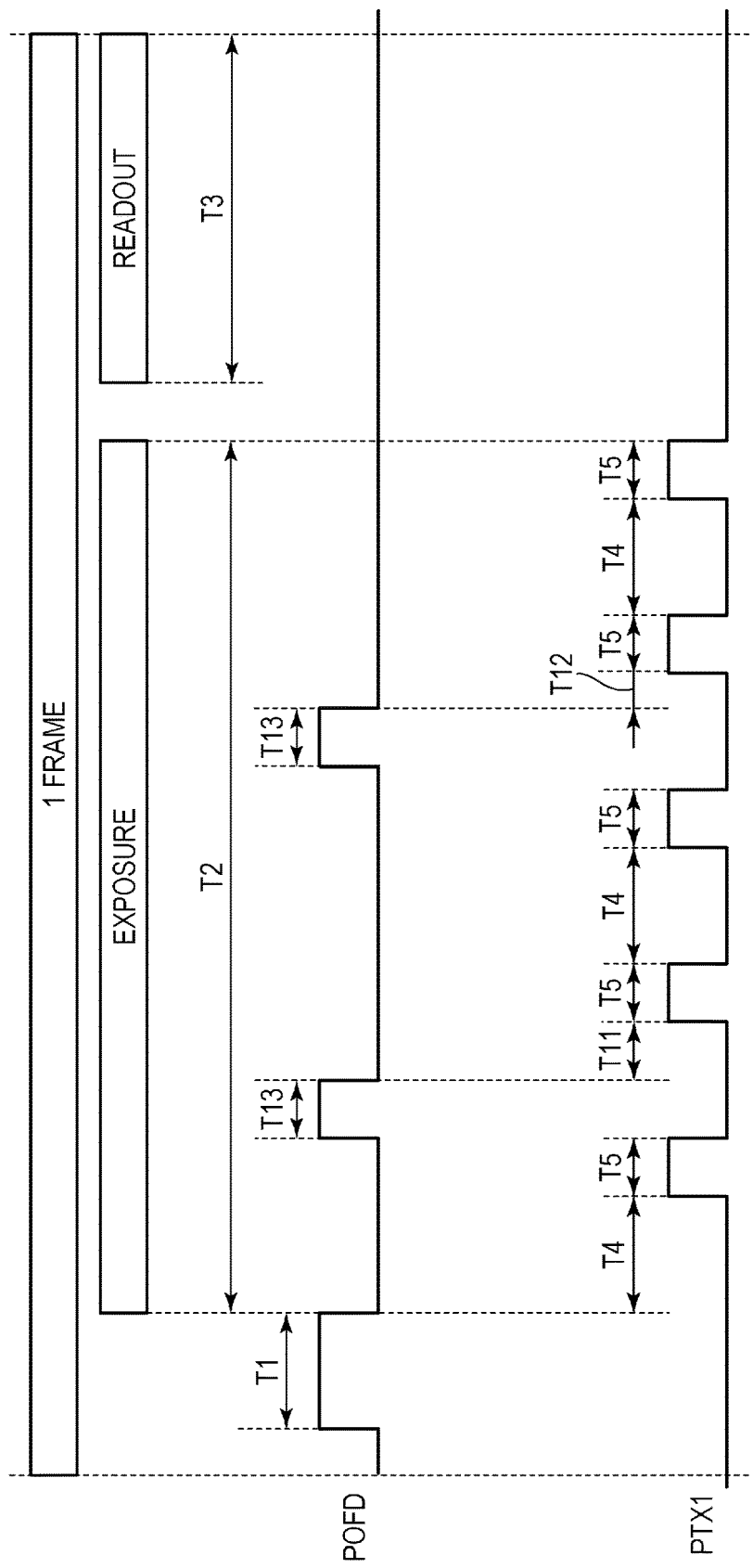
FIG. 11 is a timing diagram illustrating a method of driving a solid-state imaging device according to a third embodiment of the present invention.

FIG. 11 is a timing diagram illustrating the method of driving the solid-state imaging device according to the present embodiment. In the present embodiment, another method of driving the solid-state imaging device according to the first embodiment illustrated in FIG. 1 to FIG. 3 will be described. In the present embodiment, a method of controlling accumulation time when distributing the accumulation time by using the transfer transistor M4 will be described.

As an example application to the first embodiment, it is assumed here that the ratio of the saturation charge amount QP of the photoelectric converter PD and the saturation charge amount QM of the holding unit C1 is 1:5. The saturation charge amount QM of the holding unit C1 is the same value as that illustrated in FIG. 4 and FIG. 5 of the first embodiment.

FIG. 11 is a timing diagram illustrating the operation within one frame period when the number of signal charge transfers from the photoelectric converter PD to the holding unit C1 is five. This drive method is different from the drive method of the first embodiment illustrated in FIG. 4 in that each of periods T13 for turning on the transfer transistor M4 is included between successive two transfer operations (the periods T5) (namely, in the period T4 in which the transfer transistor M1 is in an off-state).

During a period in which the transfer transistor M4 is in an on-state, the photoelectric converter PD is in a reset state, and charges generated in the photoelectric converter PD are drained to the power source voltage line VDD. Therefore, the net accumulation period within the period T4 including the period T13 is a period from a timing at which the transfer transistor M4 is turned off to a timing at which the transfer transistor M1 is next turned on (the end of the period T4). For example, in the example of FIG. 11, the net accumulation period within the second period T4 is a period T11, and the net accumulation period within the fourth period T4 is a period T12. Therefore, the net accumulation time T2' in the entire period T2 can be expressed as Equation (2) below.

$$T2' = T4 \times 3 + T11 + T12 + T5 \times 5 \quad (2)$$

That is, in the present embodiment, an accumulation period is controlled by setting a period in which the transfer transistor M4 is turned on within the period T4 in addition to the times N of turning on the transfer transistor M1, and thereby the voltage amplitude of the node VFD is determined. When the same voltage amplitude as that of the first embodiment is used, the period T4, the period T11, and the period T12 may be adjusted as appropriate such that the accumulation time T2' is equal to the period T2 in Equation (2).

Note that the times or the interval of turning on the transfer transistor M4 and the length of the reset period T13 of the photoelectric converter PD are not limited to the example of FIG. 11, and modifications thereto are possible.

As discussed above, according to the present embodiment, since the gain of the amplifier unit can be adjusted in accordance with the signal level of the node VFD that varies with the saturation charge amount of a pixel or the number of charge transfers, a high quality image can be captured with the optimal mode suitable to a capturing condition. Further, with the transfer interval of charges being set at random, the advantage of distributed accumulation periods can be enhanced to acquire a higher quality image.

Fourth Embodiment

A solid-state imaging device and a method of driving the same according to a fourth embodiment of the present invention will be described with reference to FIG. 12 and FIG. 13. Components similar to those of the solid-state imaging device of the first to third embodiments are labeled with the same reference numerals, and the description thereof will be omitted or simplified.

Figure 12:
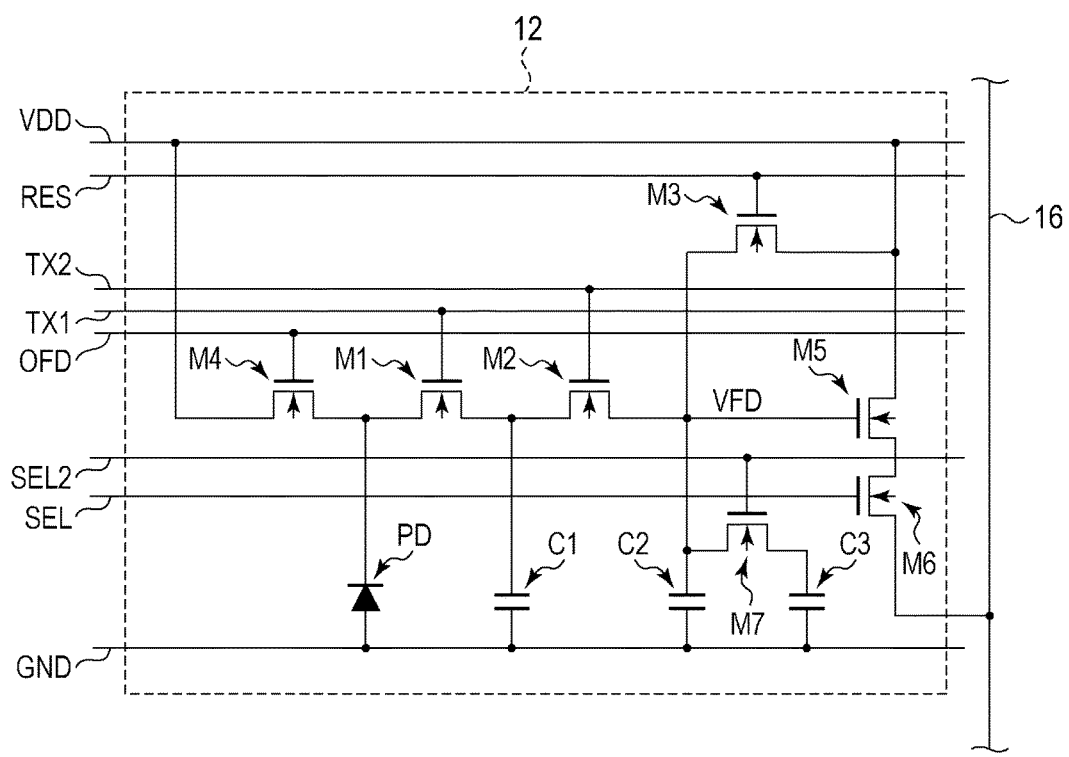
FIG. 12 is a circuit diagram illustrating an example configuration of a pixel of a solid-state imaging device according to a fourth embodiment of the present invention.

FIG. 12 is a circuit diagram illustrating an example configuration of a pixel of the solid-state imaging device according to the present embodiment. FIG. 13 is a diagram illustrating the method of driving the solid-state imaging device according to the present embodiment.

The solid-state imaging device according to the present embodiment is the same as the solid-state imaging device according to the first embodiment except that the circuit configuration of the pixel 12 is different from each other. The pixel 12 of the solid-state imaging device according to the present embodiment is different from that of the solid-state imaging device according to the first embodiment in that the holding unit C3 is connected to the node VFD via a holding unit connection transistor M7 as illustrated in FIG. 12.

By connecting the holding unit C3 to the node VFD via the holding unit connection transistor M7, the capacitance of a capacitor connected to the node VFD can be switched. That is, when the holding unit connection transistor M7 is in an off-state, the capacitance connected to the node VFD is a capacity of the holding unit C2. When the holding unit connection transistor M7 is in an on-state, the capacitance connected to the node VFD is a combined capacity of the holding unit C2 and the holding unit C3. The holding unit connection transistor M7 is a switch for switching the capacitance of the input node of the amplifier unit.

By switching the capacitance of the capacitor connected to the node VFD, it is possible to switch a change ratio of the potential of the node VFD in accordance with the charge amount transferred to the node VFD, that is, the gain of an amplifier unit whose input node is the gate of the amplifier transistor M5. In this sense, the holding unit connection transistor M7 and the holding unit C3 connected to the node VFD can be considered to be an amplifier unit. The holding unit connection transistor M7 can be controlled by a drive signal supplied to the signal line SEL2 connected to the gate thereof from the pixel drive unit 20.

Although the additional holding unit configured to be able to be connected to the node VFD is only the holding unit C3 in the present embodiment, another holding unit may be further connected. Further, the number of connected holding units may be switched in multiple steps in accordance with a setting. Further, the holding unit connection transistor M7 may be set on a frame basis, or the connection or switching operation thereof may be performed by a pulse operation within each frame. For example, connection or switching operation may be simultaneously performed on all the rows within the readout period T3, or connection or switching operation may be performed on one or more selected rows only.

Next, the operation of the solid-state imaging device according to the present embodiment will be described with reference to FIG. 13. For simplified illustration here, it is assumed that the ratio of the saturation charge amount QP of the photoelectric converter PD and the saturation charge amount QM of the holding unit C1 is 1:2.

The maximum charge amount transferred from the photoelectric converter PD to the holding unit C1 when the transfer transistor M1 is turned on once is denoted as QM1, and the maximum charge amount transferred from the photoelectric converter PD to the holding unit C1 when the transfer transistor M1 is turned on twice is denoted as QM2. When the transfer transistor M2 is turned on and charges held in the holding unit C1 are read out to the node VFD, the voltage of the node VFD will be a voltage in accordance with a ratio of the amount of charges held in the holding unit C1 and the capacity of the node VFD. For example, when the holding unit connection transistor M7 is in an off-state and the holding unit C1 holds the charge amount QM2, the voltage amplitude of the node VFD can be represented approximately as QM2/CFD1 [V], where CFD1 denotes the capacitance of the holding unit C2.

Figure 13:
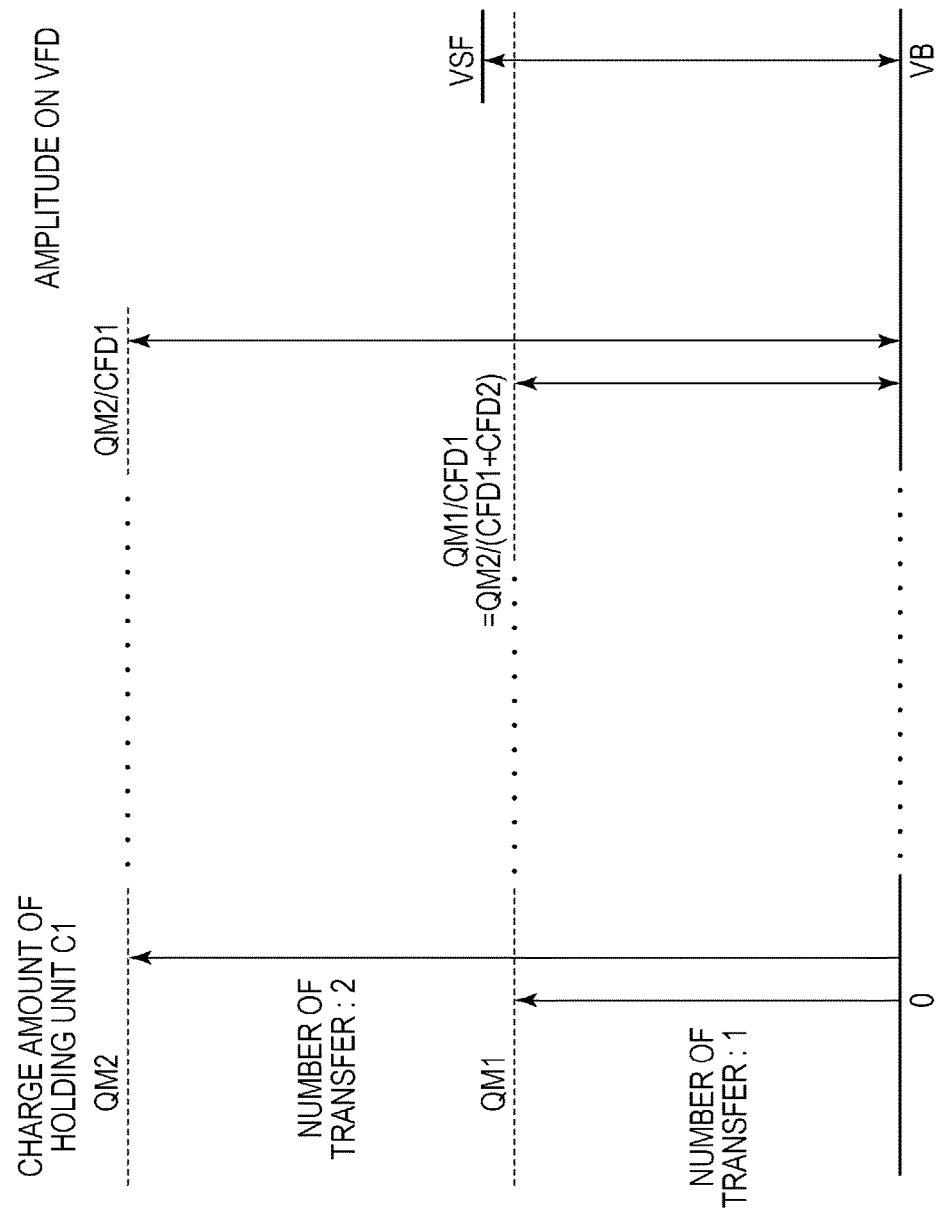
FIG. 13 is a diagram illustrating a method of driving the solid-state imaging device according to the fourth embodiment of the present invention.

In this case, for example, as illustrated in FIG. 13, the voltage amplitude of the node VFD may sometimes exceed the input range VSF [V] of the amplifier transistor M5. In such a case, the holding unit connection transistor M7 is turned on and the holding unit C3 (capacitance CFD2) is added to the node VFD to restrict the voltage amplitude of the node VFD to QM2/(CFD1+CFD2) [V]. This can suppress the voltage amplitude of the node VFD to the input range VSF [V] or less of the amplifier transistor M5.

Note that, although the case where the capacitance CFD1 of the holding unit C2 and the capacitance CFD2 of the holding unit C3 are the same has been described in the above example, the capacitance CFD1 of the holding unit C2 and the capacitance CFD2 of the holding unit C3 may not necessarily be required to be the same. Further, although the case where the charge amount QM2 is twice the charge amount QM1 has been described for simplified illustration in the above example, the amount of charges transferred from the photoelectric converter PD to the holding unit C1 varies depending not only on the number of transfers but also the length of an accumulation period as illustrated in the second embodiment, for example. The capacitance of a capacitor connected to the node VFD can be selected as appropriate taking the setting of the accumulation period into consideration.

In the present embodiment, by controlling the capacitance of the node VFD in accordance with the charge amount that varies in accordance with the times of turning on the transfer transistor M1, the voltage amplitude of an output signal can be adjusted in addition to the input/output amplitude range subsequent to the amplifier transistor M5. When the saturation charge amount (charge amount QM2) is unnecessary, the times of turning on the transfer transistor M1 may be set to one and the holding unit C2 only may be used. Furthermore, when a voltage amplitude is intended to be suppressed, the holding unit C3 may be connected.

As discussed above, according to the present embodiment, since the gain of the amplifier unit can be adjusted in accordance with the signal level of the node VFD that varies with the saturation charge amount of a pixel or the number of charge transfers, a high quality image can be captured with the optimal mode suitable to a capturing condition.

Fifth Embodiment

A solid-state imaging system according to a fifth embodiment of the present invention will be described with reference to FIG. 14. Components similar to those of the solid-state imaging device of the first to fourth embodiments illustrated in FIG. 1 to FIG. 13 are labeled with the same reference numerals, and the description thereof will be omitted or simplified.

Figure 14:
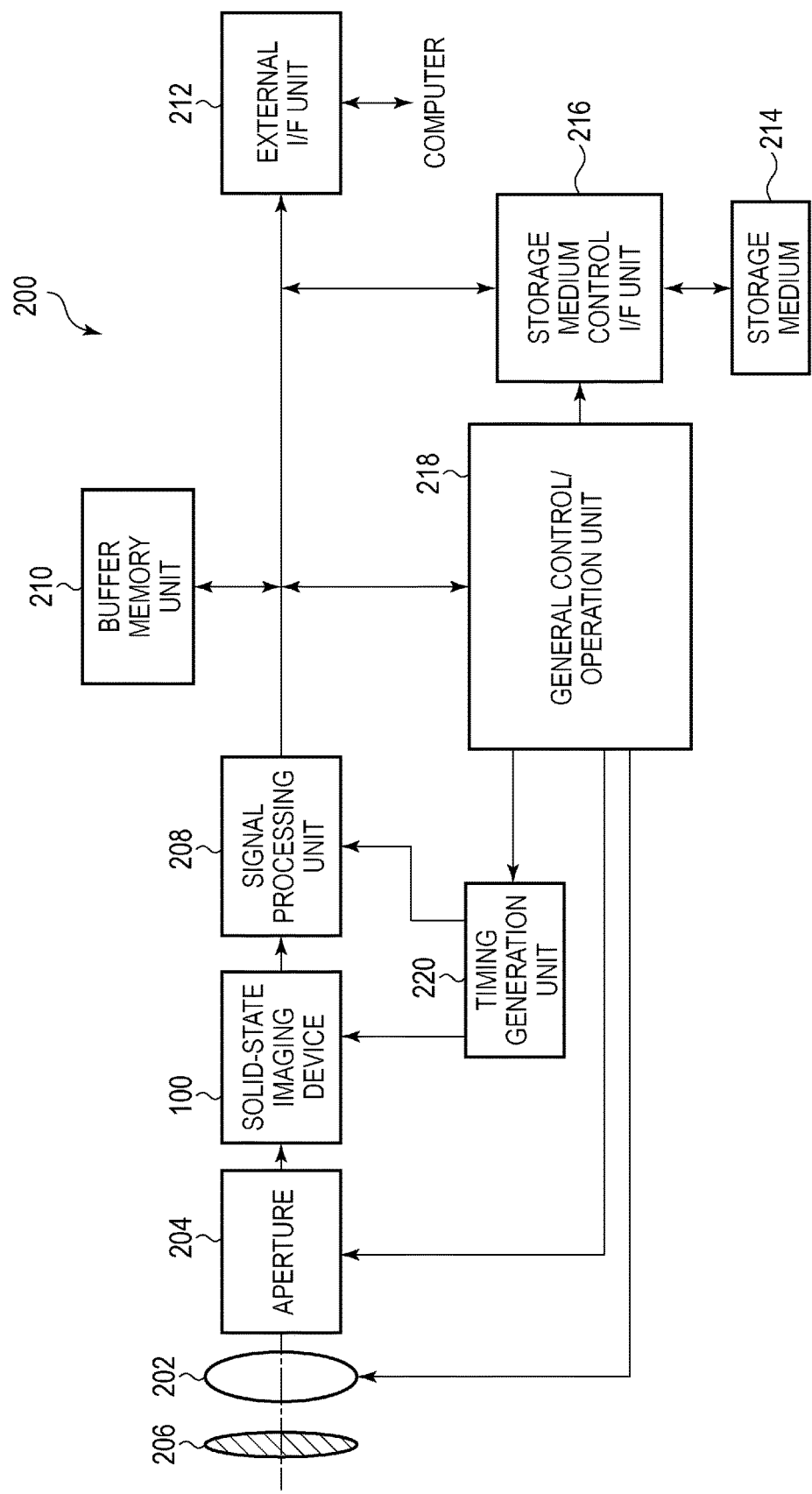
FIG. 14 is a block diagram illustrating a general configuration of an imaging system according to a fifth embodiment of the present invention.

FIG. 14 is a block diagram illustrating the configuration of the imaging system according to the present embodiment. The solid-state imaging device described in the first to fourth embodiments described above is applicable to various imaging systems. The applicable imaging systems may include, for example, a digital still camera, a digital camcorder, a surveillance camera, and so on. FIG. 14 illustrates an example of a digital still camera to which the solid-state imaging device described in the above embodiments is applied.

An imaging system 200 illustrated in FIG. 14 includes a solid-state imaging device 100, a lens 202 that captures an optical image of an object on the solid-state imaging device 100, an aperture 204 for changing the amount of light passing through the lens 202, and a barrier 206 for protecting the lens 202. The lens 202 and the aperture 204 form an optical system that collects a light on the solid-state imaging device 100. The solid-state imaging device 100 is the solid-state imaging device 100 described in the first to fourth embodiments.

The imaging system 200 has a signal processing unit 208 that processes an output signal output from the solid-state imaging device 100. The signal processing unit 208 performs various correction and compression if necessary and an operation of outputting a signal. The signal processing unit 208 may have a function of performing AD conversion processing on an output signal output from the solid-state imaging device 100. In this case, the column signal processing unit 32 of the solid-state imaging device 100 may not necessarily be required to have an AD conversion circuit.

The imaging system 200 further has a buffer memory unit 210 for temporarily storing image data and an external interface unit (external I/F unit) 212 for communicating with an external computer or the like. Furthermore, the imaging system 200 has a storage medium 214 such as a semiconductor memory for performing storage or readout of captured data and a storage medium control interface unit (storage medium control I/F unit) 216 for performing storage or readout on the storage medium 214. Note that the storage medium 214 may be embedded in the imaging system 200 or may be removable.

Furthermore, the imaging system 200 has a general control/operation unit 218 that controls various operations and the entire digital still camera and a timing generation unit 220 that outputs various timing signals to the solid-state imaging device 100 and the signal processing unit 208. Here, the timing signal or the like may be input from the outside, and the imaging system 200 may have at least the solid-state imaging device 100 and the signal processing unit 208 that processes an output signal output from the solid-state imaging device 100. The general control/operation unit 218 and the timing generation unit 220 may be configured to implement a part of or all of the functions of the drive signal generation unit 70 or the like of the solid-state imaging device 100 (for example, the function of a transfer control unit or a clip level control unit).

The solid-state imaging device 100 outputs an image-use signal to the signal processing unit 208. The signal processing unit 208 performs predetermined signal processing on an image-use signal output from the solid-state imaging device 100 and outputs image data. Further, the signal processing unit 208 generates an image by using an image-use signal.

An imaging system is configured by using the solid-state imaging device 100 according to the first to fourth embodiments, and thereby an imaging system that can acquire a higher quality image can be realized.

Sixth Embodiment

Figure 15A:
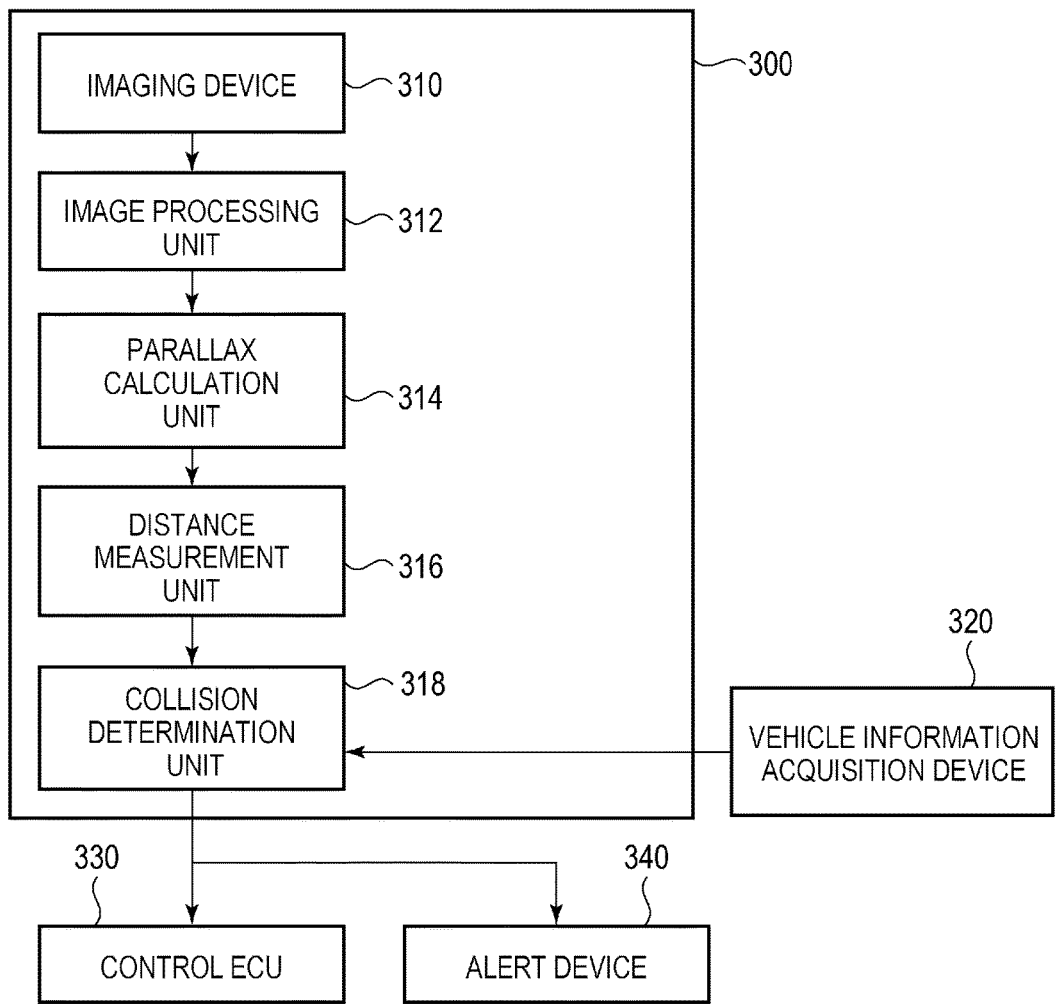
FIG. 15A is a diagram illustrating an example configuration of an imaging system according to a sixth embodiment of the present invention.
Figure 15B:
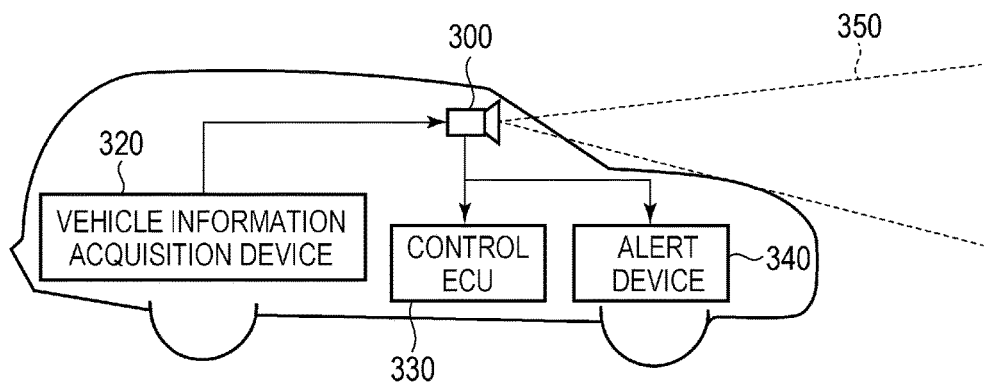
FIG. 15B is a diagram illustrating an example configuration of a movable object according to the sixth embodiment of the present invention.

An imaging system and a moving unit according to the sixth embodiment of the present invention will be described with reference to FIG. 15A and FIG. 15B. FIG. 15A is a diagram illustrating the configuration of the imaging system according to the present embodiment. FIG. 15B is a diagram illustrating the configuration of the moving unit according to the present embodiment.

FIG. 15A illustrates one example of the imaging system with respect to an on-vehicle camera. The imaging system 300 has an imaging device 310. The imaging device 310 is a solid-state imaging device described in any of the above first to fourth embodiments. The imaging system 300 has an image processing unit 312 that performs image processing on a plurality of image data acquired by the imaging device 310 and a parallax calculation unit 314 that calculates a parallax (a phase difference of parallax images) from a plurality of image data acquired by the imaging system 300. Further, the imaging system 300 has a distance measurement unit 316 that calculates a distance to an object based on the calculated parallax and a collision determination unit 318 that determines whether or not there is a possibility of a collision based on the calculated distance. Here, the parallax calculation unit 314 or the distance measurement unit 316 is an example of a distance information acquisition unit adapted to acquire information on the distance to the object. That is, the distance information is information on a parallax, a defocus amount, a distance to the object, or the like. The collision determination unit 318 may determine a collision possibility by using any of the above distance information. The distance information acquisition unit may be implemented with dedicatedly designed hardware, or may be implemented with a software module. Further, the distance information acquisition unit may be implemented by using a Field Programmable Gate Array (FPGA), an Application Specific Integrated Circuit (ASIC), or the like or may be implemented by using a combination thereof.

The imaging system 300 is connected to a vehicle information acquisition device 320 and can acquire vehicle information such as a vehicle speed, a yaw rate, a steering angle, or the like. Further, the imaging system 300 is connected to a control ECU 330, which is a control device that outputs a control signal for generating braking force to the vehicle based on the determination result in the collision determination unit 318. Further, the imaging system 300 is connected to an alert device 340 that issues an alert to a driver based on the determination result in a collision determination unit 318. For example, when the determination result of the collision determination unit 318 indicates a high possibility of a collision, the control ECU 330 performs vehicle control to avoid a collision or reduce damage by applying a break, moving back the accelerator pedal, suppressing the engine power, or the like. The alert device 340 performs an alert to a user by sounding an alert such as a sound, displaying alert information on a screen of a car navigation system or the like, providing a vibration to a seat belt or a steering wheel, or the like.

In the present embodiment, the surrounding area of the vehicle, for example, the area in front or rear is captured by the imaging system 300. FIG. 15B illustrates an imaging system when the area in front of the vehicle (a capturing area 350) is captured. The vehicle information acquisition device 320 instructs the imaging system 300 to the imaging device 310 to perform the operation described in the above first to fourth embodiments. Since the operation of the imaging device 310 is the same as that of the first to fourth embodiments, the description thereof will be omitted here. Such a configuration can further improve the accuracy of ranging.

Although the example of control for avoiding a collision to another vehicle has been illustrated in the present embodiment, the embodiment is applicable to automatic driving control for following another vehicle, automatic driving control for not going out of a traffic lane, or the like. Furthermore, the imaging system is not limited to a vehicle such as the subject vehicle, and can be applied to a movable object (movable apparatus) such as a ship, an airplane, or an industrial robot, for example. In addition, the imaging system can be widely applied to a device which utilizes object recognition, such as an intelligent transportation system (ITS), without being limited to moving units.

Modified Embodiments

The present invention is not limited to the above-described embodiments, and various modifications are possible.

For example, the embodiments of the present invention include an example in which a part of the configuration of one of the embodiments is added to another embodiment or an example in which a part of the configuration of one of the embodiments is replaced with a part of the configuration of another embodiment.

Further, although the case where a solid-state imaging device is driven by the global electronic shutter has been described in the above embodiments, the present invention can be applied similarly to a case where a solid-state imaging device is driven by the rolling electronic shutter.

Further, although the description has been provided in the above-described embodiment for the case where each transistor of the pixel 12 is formed of an n-channel transistor, each transistor of the pixel 12 may be formed of a p-channel transistor. In this case, the signal level of each drive signal in the above description is inverted.

Further, the circuit configuration of the pixel 12 is not limited to that illustrated in FIG. 2 or FIG. 12, and can be changed as appropriate. For example, the transfer transistor M4 is not necessarily required to be provided in the solid-state imaging device of the first, second, or fourth embodiment, and the photoelectric converter PD may be reset through the reset transistor M3 and the transfer transistors M2 and M1.

Further, the imaging systems illustrated in the fifth and sixth embodiments each are an example imaging system to which the solid-state imaging device of the present invention may be applied, and an imaging system to which the solid-state imaging device of the present invention can be applied is not limited to the configurations illustrated in FIG. 14, FIG. 15A and FIG. 15B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-199129, filed Oct. 7, 2016, which is hereby incorporated by reference herein in its entirety.

What is claimed is:

1. A solid-state imaging device comprising:
a plurality of pixels, each of the plurality of pixels including a photoelectric converter configured to generate charges by photoelectric conversion, a holding unit configured to hold charges generated by the photoelectric converter, and a transfer unit configured to transfer charges from the photoelectric converter to the holding unit, and each of the plurality of pixels outputting a signal based on charges held in the holding unit;
an output line connected to the plurality of pixels, the signal being output from the plurality of pixels to the output line;
a transfer control unit configured to control the transfer unit to transfer charges generated by the photoelectric converter during one exposure period to the holding unit by a variable number of transfer operations, the variable number being one or greater;
an amplifier unit configured to amplify the signal; and
a control unit configured to control a gain of the amplifier unit to be a first gain when the number of transfer operations is a first number and to be a second gain larger than the first gain when the number of transfer operations is a second number smaller than the first number.

2. The solid-state imaging device according to claim 1, wherein the control unit controls the gain so that a signal level corresponding to a saturation charge amount of the pixel in accordance with the number is included in an input range or an output range of the amplifier unit.

3. The solid-state imaging device according to claim 2, wherein the number corresponds to a ratio of a saturation charge amount of the holding unit to a saturation charge amount of the photoelectric converter.

4. The solid-state imaging device according to claim 2, wherein the control unit increases the gain as the number decreases.

5. The solid-state imaging device according to claim 1, wherein, when the number is equal to or greater than a number corresponding to a ratio of a saturation charge amount of the holding unit to a saturation charge amount of the photoelectric converter and the signal is smaller than a signal level corresponding to a maximum saturation charge amount of the pixel, the control unit increases the gain as the number increases.

6. The solid-state imaging device according to claim 1, wherein accumulation periods for charge accumulation each of which is provided between the transfer operations in the exposure are uneven.

7. The solid-state imaging device according to claim 6, wherein the control unit controls timings of the transfer operations to cause the accumulation periods to be uneven.

8. The solid-state imaging device according to claim 6,
wherein each of the plurality of pixels further includes a reset unit configured to reset charges of the photoelectric converter, and
wherein the control unit controls the reset unit to reset the photoelectric converter between successive two of the transfer operations so that accumulation periods are uneven.

9. The solid-state imaging device according to claim 6,
wherein the plurality of pixels are arranged over a plurality of rows, and
wherein timings of the accumulation periods are different for respective rows.

10. The solid-state imaging device according to claim 6, wherein timings of the accumulation periods are different among the exposure periods.

11. The solid-state imaging device according to claim 1, wherein the control unit sets the number and the gain based on a signal level of the signal in a previous exposure period.

12. The solid-state imaging device according to claim 1, wherein the amplifier unit amplifies the signal output to the output line.

13. The solid-state imaging device according to claim 1, wherein each of the plurality of pixels includes the amplifier unit and a second transfer unit configured to transfer charges of the holding unit to an input node of the amplifier unit.

14. The solid-state imaging device according to claim 13, wherein the control unit controls the gain of the amplifier unit by switching a capacitance value of the input node of the amplifier unit.

15. The solid-state imaging device according to claim 14,
wherein each of the plurality of pixels includes a switch configured to switch the capacitance value of the input node of the amplifier unit,
wherein the control unit turns on the switch when the number is a first value, and control unit turns off the switch when the number is a second value that is less than the first value.

16. A method of driving a solid-state imaging device including a plurality of pixels, each of the plurality of pixels including a photoelectric converter configured to generate charges by photoelectric conversion, a holding unit configured to hold charges generated by the photoelectric converter, and a transfer unit configured to transfer charges from the photoelectric converter to the holding unit, and each of the plurality of pixels outputting a signal based on charges held in the holding unit, an output line connected to the plurality of pixels, the signal being output from the plurality of pixels to the output line, and an amplifier unit that amplifies the signal, the method comprising:
transferring charges generated by the photoelectric converter during one exposure period to the holding unit by a variable number of transfer operations, the variable number being one or greater; and
controlling a gain of the amplifier unit to be a first gain when the number of transfer operations is a first number and to be a second gain larger than the first gain when the number of transfer operations is a second number smaller than the first number.

17. The method of driving the solid-state imaging device according to claim 16, wherein the exposure period is the same among the plurality of pixels.

18. An imaging system comprising:
a solid-state imaging device according to claim 1; and
a signal processing unit configured to process the signal output from the pixels of the solid-state imaging device.

19. A movable object comprising:
a solid-state imaging device according to claim 1;
a distance information acquisition unit configured to acquire distance information of a distance to an object based on a parallax image based on a signal from the solid-state imaging device; and
a controlling unit configured to control the movable object based on the distance information.

* * * * *